United States Patent [19]

Matsumoto et al.

[11] Patent Number: 5,302,855
[45] Date of Patent: Apr. 12, 1994

[54] CONTACT ELECTRODE STRUCTURE FOR SEMICONDUCTOR DEVICE

[75] Inventors: Shigeyuki Matsumoto; Masaru Sakamoto; Yoshio Nakamura, all of Atsugi, Japan

[73] Assignee: Canon Kabushiki Kaisha, Tokyo, Japan

[21] Appl. No.: 757,480

[22] Filed: Sep. 10, 1991

[30] Foreign Application Priority Data

Sep. 10, 1990 [JP] Japan ................................ 2-240494
Sep. 12, 1990 [JP] Japan ................................ 2-239981

[51] Int. Cl.$^5$ ...................... H01L 23/48; H01L 29/44
[52] U.S. Cl. .................................. 257/774; 257/775; 257/784; 257/771
[58] Field of Search ................. 357/65, 68, 71; 257/771, 774, 775, 784

[56] References Cited

U.S. PATENT DOCUMENTS

| | | | |
|---|---|---|---|
| 4,742,014 | 5/1988 | Hooper et al. ................. | 437/192 |
| 4,938,996 | 7/1990 | Ziv et al. ....................... | 427/53.1 |
| 4,948,755 | 8/1990 | Mo ................................ | 357/71 |
| 4,958,222 | 9/1990 | Takakura et al. .............. | 357/71 |
| 5,008,731 | 4/1991 | Van de Grift et al. ......... | 257/775 |
| 5,045,916 | 9/1991 | Vor et al. ...................... | 357/71 |
| 5,061,983 | 10/1991 | Egawa et al. ................. | 357/71 |
| 5,061,985 | 10/1991 | Meguro et al. ................ | 357/71 |
| 5,063,175 | 11/1991 | Broadbent .................... | 357/71 |
| 5,063,436 | 11/1991 | Grüning et al. ................ | 357/65 |
| 5,093,711 | 3/1992 | Hirakawa ...................... | 357/71 |
| 5,099,308 | 3/1992 | Murayama .................... | 357/71 |
| 5,126,819 | 6/1992 | Abe et al. ...................... | 257/775 |

FOREIGN PATENT DOCUMENTS

| | | |
|---|---|---|
| 0194109 | 10/1986 | European Pat. Off. . |
| 0199030 | 10/1986 | Fed. Rep. of Germany . |
| 0304728 | 3/1989 | Fed. Rep. of Germany . |
| 60-183784 | 9/1985 | Japan . |
| 62-95869 | 5/1987 | Japan ................. 357/71 |
| 63-29953 | 2/1988 | Japan ................. 357/71 |
| 63-33569 | 2/1988 | Japan . |
| 1-94651 | 4/1989 | Japan ................. 357/71 |
| 2-63169 | 3/1990 | Japan ................. 357/71 |

OTHER PUBLICATIONS

S. D. Mehta, "Applications of CVD Tungsten in VLSI Circuits," *Proceedings of the IEEE* 1989 Custom Integrated Circuits Conference 15-18, May 1989, pp. 18.1.1-18.1.8.
"Method of Containing Conductors Through Contact Holes," *IBM Technical Disclosure Bulletin*, vol. 31, No. 10, Mar. 1989, pp. 202-203.
Tsubouchi et al., "Complete Planarization of Via Holes with Aluminum by Selective and Nonselective Chemical Vapor Deposition." Appl. Phys. Sep. 1990.
Levy et al., "Characterization of LPCVD Aluminum for VLSI Processing." Journal of the Electrochemical Society, vol. 131, No. 9, 1984.
T. Amazawa et al., "Selective Deposition of Aluminum Using Double-Wall CVD," *Proceedings of 2nd Symposium by Japanese Branch of Electrochemical Society*, Jul. 7, 1989.
R. A. Levy et al., "Characterization of LPCVD Aluminum for VLSI Processing", J. Electrochem. Soc., 131, 2175-82 (1984).
Proc. 2d Symp. Electrochem. Soc., Jap. Branch, 75 (Jul. 7, 1989).

*Primary Examiner*—Rolf Hille
*Assistant Examiner*—Mahshid Saadat
*Attorney, Agent, or Firm*—Fitzpatrick, Cella, Harper & Scinto

[57] ABSTRACT

A semiconductor device and a manufacture method for the semiconductor device, the method comprising the steps of forming an insulating film on the surface of a semiconductor substrate, forming contact holes in the insulating layer to expose the surface of the semiconductor substrate, selectively depositing a metal film, which contains aluminum as a main ingredient, on the exposed surface to form an electrodes in each the contact hole, and forming a wiring made of a second metal, which contains as a principal ingredient an element other than aluminum, on both the insulating layer and the electrode. Preferably, the upper surface of each electrode is substantially flat in a connecting portion between the electrode and the wiring, and a relationship of $A \geq C$ is established where A is a length of one side of the electrode's upper surface and C is a width of the wiring in the connecting portion therebetween. The metal film is produced at a high deposition rate and a high throughput while ensuring good reliability and presenting superior film characteristics such as step coverage and electro migration.

5 Claims, 17 Drawing Sheets

CONTACT ELECTRODE STRUCTURE FOR SEMICONDUCTOR DEVICE

BACKGROUND OF THE INVENTION

1. Field of the Invention

The present invention relates to a semiconductor integrated circuit device, and more particularly to an electrode structure of the device for use in semiconductor memories, photoelectric transducers, signal processors and so on which are mounted on various electronic equipment such as copying machines, facsimile apparatus, printers, silver salt cameras, video tape recorders and image displays and, though small in size, considerably affect specifications of the equipment.

2. Related Background Art

In electronic devices and integrated circuit elements each using semiconductors, aluminum (Al), aluminum containing silicon (Al-Si) or the like have been conventionally employed to form electrodes and wirings (conductor patterns). Al has many advantages that it is cheap and exhibits high electric conductivity, can chemically protect and stabilize the interior because of a dense oxide film formed on the surface, and has good adhesivity with Si.

Meanwhile, in recent years, an increased degree of integration of integrated circuits like LSIs has particularly required a decrease of the wire or conductor size and multiple layers of wirings, thereby in turn imposing so strict demands as have not been experienced so far on the wirings. In dynamic RAMs of 4 Mbit and 16 Mbit, for example, the aspect ratio (i.e., opening depth/opening diameter) of an opening (so-called beer hole) in which a metal like Al must be deposited is more than 1.0. Also, the opening diameter itself is below 1 μm. This necessitates a technique which can deposit Al even in openings having the large aspect ratio.

Additionally, in order to achieve commerical success, semiconductor integrated circuit devices must be mass-produced at the low production cost.

To date, there have been known, as methods of forming metal films like Al films, a sputtering process and a vapor phase process such as a CVD (Chemical Vapor Deposition) process using trimethylaluminum (TMA). Above all, the thermal CVD process has been researched from wide and various angles. One example is to disperse organic aluminum in carrier gas for transporting it over a heated substrate, so that gas molecules are thermally decomposed on the substrate to form a film. As described in Journal of Electrochemical Society, Vol. 131, p. 2175 (1984), by way of example, triisobutylaluminum (i-$C_4H_9$)$_3$Al(TIBA) is used as organic aluminum gas to form a film of 3.4 μΩ.cm at the film forming temperature of 260° C. and the reaction tube pressure of 0.5 Torr, However, the above method is so poor in surface flatness of Al as not to provide a film of good quality from the standpoints of step coverage and electro migration. In addition, Al deposited in openings is not dense.

Further, Japanese Patent Laid-Open No. 63-33569 discloses a method of forming a film by heating organic aluminum in the vicinity of a substrate. This method enables to selectively deposit Al by the CVD process only on those surface areas of a metal or semiconductor from which the natural surface oxide film has been removed away. With the disclosed method, after filling openings, Al is deposited on the oxide film by the sputtering process.

That method also has, however, a disadvantage that since surface flatness of Al in openings, as major basic condition for a good film, electric contact at the interface between the Al film formed by the CVD process and the Al film formed by the sputtering process is poor, which in turn increases resistivity.

As a modified example, a double-wall CVD process is described in Proceedings of 2nd Symposium by Japanese Branch of Electrochemical Society, (Jul. 7, 1989), p. 75. While this process enables to selectively grow Al only on metals or semiconductors using TIBA gas, it is disadvantageous in that difficulties are encountered in precise control of a difference between the gas temperature and the substrate surface temperature, and that both a bomb and a pipe must be heated.

Stated otherwise, an attempt of controlling the above temperature difference complicates production apparatus and thus necessarily leads to a single-substrate processing type that can deposite Al on only one wafer for each deposition process. Moreover, the modified method can only produce a film, which is never said as being of good quality, at a deposition rate of 500 Å/min at maximum and thus cannot realize a throughput necessary for mass production. In addition, the film formed by the modified method does not become a uniform and continuous film unless it is deposited up to some thickness. The formed film is also unsatisfactory in reproducibility and insufficient for mass production because film flatness is poor and selectivity needed in selective growth of Al will not last for a so long time.

Thus, in the conventional methods, since a metal is not sufficiently filled in contact holes or the like which are partially exposed to an insulating film, the filled metal cannot be said as being of good quality in itself, thereby causing an increase of the wire resistance, a wire breakage and other troubles. An attempt of preventing such shortcomings inevitably increases thicknesses of Al films and inter-layer insulating films, which is contrary to a direction toward improved flatness necessary for a reduction in the element size and a higher degree of integration. This has in turn adversely affected not only performance of semiconductor devices but also yield of production to a large extent.

Even with the filled metal being of good quality and having satisfactory selectivity, if wiring material interconnecting filled lead-out electrodes is aluminum-base material such as aluminum or an alloy containing aluminum as a main ingredient, wiring characteristics are deteriorated due to stress migration or electro migration. In this respect, therefore, a further improvement has been demanded. It has also been desired to obtain other wiring material having lower resistance than an aluminum-base metal.

In summary, the conventional CVD processes have suffered from the problem that an improvement in the deposition rate and output, which is essential to mass production of semiconductor integrated circuit devices at the low cost, cannot be expected and satisfactory selective growth of Al cannot be realized. Even if satisfactory selective growth of Al is obtained, there still remain problems in flatness, purity, step coverage and dense filling of Al into contact holes, meaning poor reproducibility. In other words, there have been left many points to be improved for a higher degree of integration.

SUMMARY OF THE INVENTION

An object of the present invention is to solve the above-mentioned technical problems in the prior art and to provide a metal film forming method which can produce a metal film at a high deposition rate and a high output.

Another object of the present invention is to provide a metal film forming method which has superior selectivity and can form a metal film even in openings having a large aspect ratio.

Still another object of the present invention is to provide electrode and wiring structures of a semiconductor device which are formed by depositing an Al-base metal of good quality in openings using a film forming method with superior selectivity, and then depositing a metal other than the Al-base one all over the surface using a non-selective film forming method, and which gives good contact between the metal first deposited in the openings, which metal is superior in both conductivity and flatness, and the metal deposited thereafter, has low resistivity, and is highly resistant against electro migration and stress migration, as well as electrode and wiring structures fabricated by the metal film forming method which can form an excellent metal film.

To achieve the above objects, a semiconductor device according to one embodiment of the present invention comprises a semiconductor substrate, an insulating layer formed on a principal plane of the semiconductor substrate and having openings, electrodes provided in the openings and each including a first metal film which contains aluminum as a main ingredient, and a wiring provided on both the insulating layer and the first metal film and including a second metal film which contains as a main ingredient an element other than aluminum.

A manfacturing method for the semiconductor device according to one embodiment of the present invention comprises the steps of forming an insulating film on the surface of a semiconductor substrate, forming contact holes in the insulating layer to expose the surface of the semiconductor substrate, selectively depositing a metal film, which contains aluminum as a main ingredient, on the exposed surface to form an electrode in each contact hole, and forming a wiring made of a second metal, which contains as a main ingredient an element other than aluminum, on both the insulating layer and the electrode.

With the above embodiments, Al selectively deposited in the contact holes becomes monocrystalline material of good quality and gives a dense film superior in surface flatness. On the deposited Al, selective deposition/non-selective deposition can be performed continuously without making the substrate exposed to the open air. In the selective deposition, Al is selectively deposited in the contact holes based on a surface reaction at low temperatures using DMAH and $H_2$ gas. The resulting Al is very superior as electrode material for the semiconductor device because of giving an Al film with good quality and very excellent selectivity. Further, the second metal film is formed throughout on the insulating layer to permit a wiring in the form of multiple layers. It has been found that the Al film deposited in each contact hole is a monocrystal superior in surface flatness. With the insulating film surface inclusive of the surface of such monocrystalline Al, satisfactory continuous connection to the Al-base film selectively deposited in the contact hole can be maintained even when the second metal film is formed by the sputtering or CVD process. This enables to produce the wiring of small specific resistance.

Additionally, fine electrode and wiring structures can be obtained because the second metal film as the wiring material has small specific resistance and is highly resistant against migration.

Meanwhile, as the element size is reduced, the semiconductor device of the above structure still has several problems, such as an increase of the resistance value and a decrease of reliability, and cannot yet exhibit characteristics sufficiently suitable for the reduced element size.

FIG. 1 shows on example of a wiring portion in the semiconductor device. Denoted by 701 is a semiconductor substrate, 702 is a function area (i.e., a diffusion area of an impurity), 703 is an insulating film, 704 is a contact hole of substantially square shape (A×A size), and 705 is an electrode and wiring area. X and Y represent breadth and length sizes of the occupied area and are expressed by X=3A+6B+2C and Y=2A+4B, respectively.

Here, A is hole size, B is an overlap margin between the hole and the wiring, and C is a separation width of the wiring between the adjacent two conductors.

In the above structure, a reduction in the hole size A tends to cause the problem such as lowering reliability due to an increase of the contact resistance and a deterioration of wire coating (i.e., step coverage). A reduction in the margin B tends to cause the problem such as lowering reliability and yield of production. A reduction in the separation width C tends to cause the problem such as increasing the wiring resistance and short-circuiting between conductors of the wiring.

Therefore, researches on new materials, devices, structures and so forth have been intensively conducted with a view of reducing the element size in relation to the wiring.

In particular, many reports have been publicized as regards to the reduction in the hole size A.

By way of example, selective deposition is utilized to provide a barrier metal like TiN or TiW between the semiconductor substrate and the electrode, or to form a buried electrode structure that the contact hole is filled with the electrode material. It is the current state of the art that the conventional selective deposition process cannot produce a film having sufficient flatness and good quality. In short, there still remain several technical problems to be solved in points of film quality, stability, reliability due to the increased number of steps, cost and so forth.

To solve the above technical problems, therefore, another embodiment of the present invention provides a semiconductor device and a manufacture method for the device in which the element size is reduced while ensuring high reliability and presenting an improved electrode structure. Specifically, this embodiment provides a semiconductor device and a manufacture method for the device in which a degree of freedom in design is so increased as to minimize the aforesaid B (i.e., the overlap margin between the contact hole and the wiring) to the extent possible, and semiconductor elements can be finely fabricated to present an electrode structure of the semiconductor elements suitable for driving at a high speed and a large current. For that purpose, according to this embodiment, in a semiconductor device having electrodes provided on a principal plane of a semiconductor substrate and connected to semiconductor elements, and a wiring connected to the electrodes, the upper surface of each of the electrodes is flat in a connecting portion between the electrode and the wiring, and a relationship of $A \geq C$ is established where A is a length of one side of the upper surface of each electrode and C is a width of the wiring in the connecting portion therebetween.

According to other embodiments of the present invention, the above object is also achieved in the above structure by further (1) providing a barrier metal between the electrode and the wiring, (2) using monocrystalline wiring material only over the electrodes and polycrystalline wiring material over the insulating film, (3) making the electrode material and the wiring material different from each other, and/or (4) increasing a film thickness of the electrodes and the wiring by the selective CVD process after the formation of the wiring.

Achievement of the above object is mainly attributable to the stable buried electrode structure. Although various papers have so far been reported about buried electrodes, there have accompanied many problems from the standpoint of reliability, such as a gap occurred between an oxide film and an electrode, impurities contained in the film, and a damage caused by etchback or the like.

In this embodiment, those problems are solved by using an improved CVD process (described later), thereby enabling to form a fine electrode structure with high reliability.

Moreover, the wiring width has been conventionally set much greater than one side of the contact hole to take a sufficient margin. To the contrary, in this embodiment, the wiring width is set equal to, preferably smaller than, one side of the contact hole, based on a quite novel concept which has never been conceived up to now. As a result, the fine wiring with high reliability can be formed while securing the margin which is small but sufficient.

BRIEF DESCRIPTION OF THE DRAWINGS

FIGS. 3 to 5 illustrate one example of a metal film continuously forming apparatus suitable for implementing the present invention, wherein; FIG. 3 is a schematic view of successive steps developed into a line in order, FIG. 4 is a schematic plan view showing the apparatus construction, and FIG. 5 is a schematic plan view similar to FIG. 4 added with arrows indicating the order of movement of a substrate.

DETAILED DESCRIPTION OF THE PREFERRED EMBODIMENTS

Hereinafter, preferred embodiments of the present invention will be described in detail with reference to the attached drawings.

Figure 2:
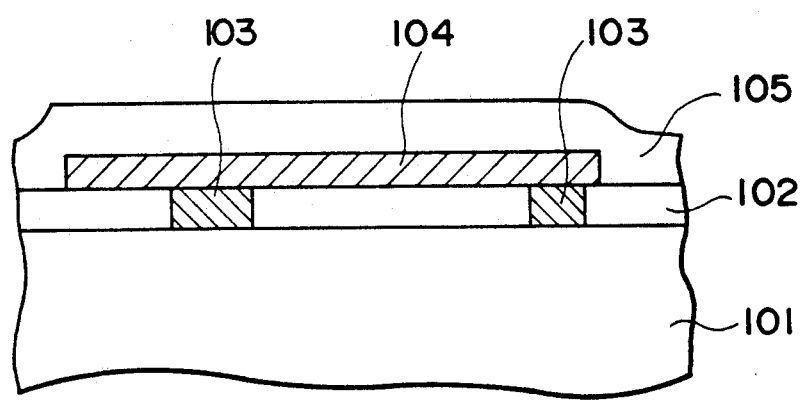
FIG. 2 is a schematic sectional view of one embodiment of a semiconductor device according to the present invention.

FIG. 2 is a schematic sectional view showing one embodiment of a semiconductor device according to the present invention, Contact holes are defined in an insulating film 102, coated on a semiconductor substrate 101, to expose the substrate surface. Aluminum or an alloy 103 containing aluminum as a main ingredient is deposited to fill the contact holes. The aluminum or the alloy 103 containing aluminum as a main ingredient constitutes lead-out electrodes of MOS transistors, bipolar transistors and the like which are formed on the semiconductor substrate 101. The electrodes 103 are each selectively deposited on the semiconductor substrate by a CVD process using an alkylaluminum hydride and hydrogen, explained later in detail. A wiring (conductor pattern) is formed to interconnect the electrodes 103, followed by coating an insulating film 105 thereon. The wiring 104 is formed of a second metal not containing aluminum as a main ingredient. It is also possible to define through holes in the insulating film 105 to reach the wiring layer 104, selectively deposit aluminum in the through holes, and then provide another wiring layer formed of the second metal thereon, thus forming a multi-layered wiring structure. Note that the present invention is not limited to the embodiments explained here and may be modified within a scope of enabling to achieve the object of the present invention.

The present invention is to form a metal deposition film by a thermal CVD process in such a manner as to directly heat the substrate surface under resistance heating or by a lamp, when an Al-base film is formed on an electron donor substrate using gas of an alkylaluminum hydride and hydrogen gas. The aluminum film or the alloy film containing aluminum as a main ingredient (hereinafter referred to as Al-base film), which can be formed by the present invention to be used as the electrodes, is a film composed of Al, Al-Si, Al-Cu or Al-Ti. The second metal constituting the wiring is in practice Cu, Ti, Au or an alloy containing any of these elements as a main ingredient. The second metal is deposited by the usual CVD or sputtering process.

The surface temperature of the substrate during the selective deposition of Al is preferably not lower than the decomposition temperature of the alkylaluminum hydride and less than 450° C., more preferably not lower than 260° C. and not higher than 440° C.

In particular, the Al film of good quality can be formed by using monomethylaluminum hydride (MMAH) or dimethylaluminum hydride (DMAH) as material gas, using $H_2$ gas as reaction gas, and heating the substrate surface by a lamp under an atmosphere of gas mixture.

In this case, by setting the surface temperature of the substrate during formation of the Al film within a more preferable range of 260° C. to 440° C., the good quality film can be obtained at a higher deposition rate of 3000 to 5000 Å/min than the case of utilizing resistance heating.

A method of direct heating (i.e., directly conducting energy from a heating means to the substrate to heat it per se) which can be employed in the present invention includes, for example, lamp heating by a halogen lamp, xenon lamp or the like. Alternatively, an example of indirect heating is resistance heating. In this example, a resistance heater or the like is provided on a substrate supporting member disposed in a space supporting the substrate, on which the deposition film is to be formed, for forming the deposition film.

Al deposited in the holes (openings) by the method stated above exhibits a monocrystalline structure and has superior characteristics against; (1) reduction in occurrence probability of hillocks, and (2) reduction in occurrence probability of alloy spikes. Because the above-stated method is a deposition method superior in selectivity, the metal film suitable for the wiring of the semiconductor device can be obtained by using a non-selective deposition method as a next deposition step to form the second metal film over not only the first Al-base film selectively deposited but also the insulating film of $SiO_2$ or the like.

FIGS. 3 to 8 illustrate several examples of a metal film continuously forming apparatus suitable for implementing the present invention.

Figure 3:
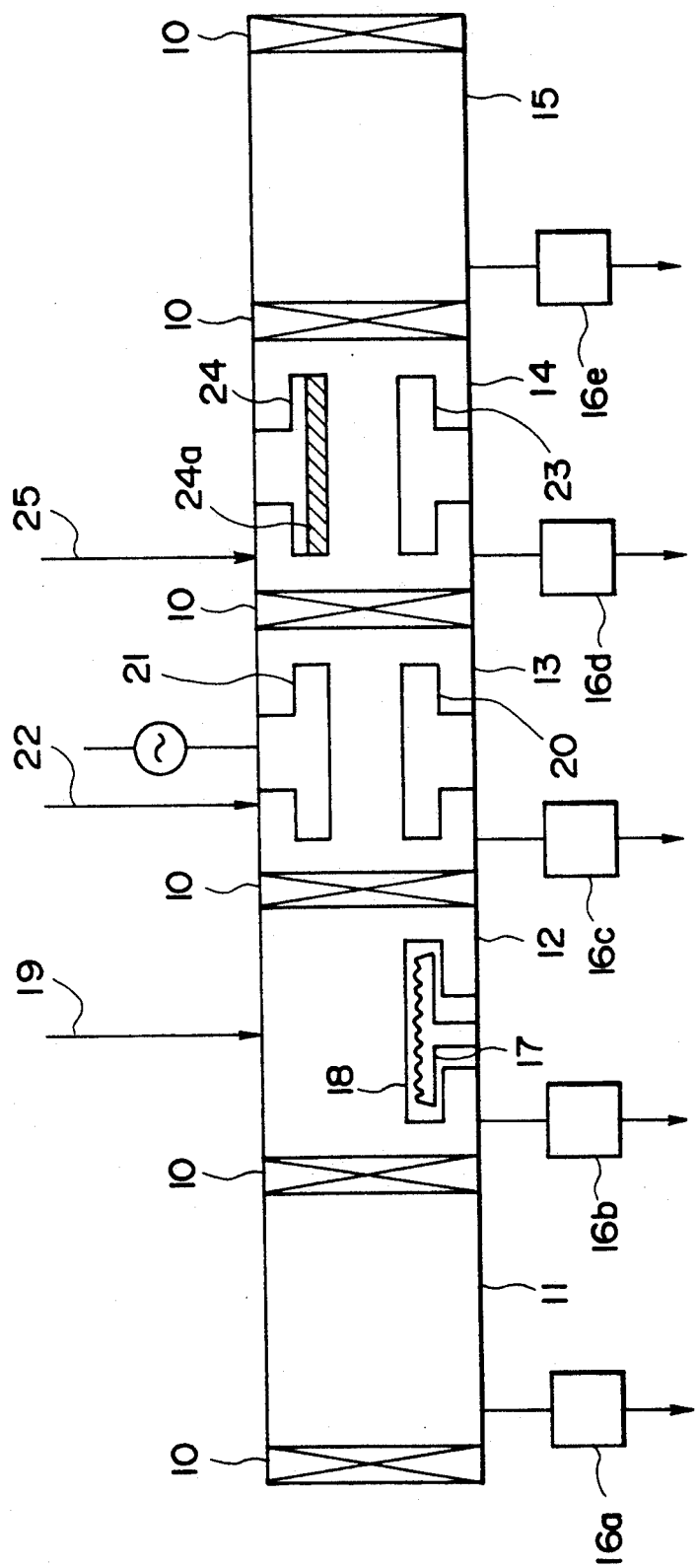

One example of the metal film continuously forming apparatus comprises, as shown in FIG. 3, a load lock chamber 11, a CVD reaction chamber (first film forming chamber) 12, an Rf etching chamber 13, a sputtering chamber (second film forming chamber) 14, and a load lock chamber 15 which are joined to be communicated with each other successively through gate valves 101 under a condition cut off from the open air. The interiors of those chambers are respectively evacuated or depressurized by evacuation systems 16a to 16e. The load lock chamber 11 is used to evacuate an atmosphere around the substrate before the deposition process and to replace it with an $H_2$ atmosphere for the purpose of improving a throughput. The next CVD reaction chamber 12 is used to carry out the selective deposition on the substrate under normal pressure or reduced pressure. A substrate holder 18 having a resistance heater 17 )for heating the substrate to temperatures of in a range of 200° C.-430° C.) is provided inside the chamber 12 and CVD gas is introduced to the chabmer 12 through a CVD gas introduction line 19. The next Rf etching chamber 13 is used to carry out cleaning (etching) of the substrate surface after the selective deposition under an Ar atmosphere. In the chamber 13, there are provided a substrate holder 20 heated to temperatures of in a range of 100° C.-250° C. and an electrode line 21 for Rf etching, with an Ar gas supply line 22 connected to the chamber 13. The next sputtering chamber 14 is used to non-selectively deposit a metal film on the substrate surface by sputtering under the Ar atmosphere. In the chamber 14, there are provided a substrate holder 23 heated to temperatures of in a range of 200° C.-250° C. and a target electrode 24 to which a sputtering target material 24a is attached, with an Ar gas supply line 25 connected to the chamber 14. The final load lock chamber 15 is used to make an adjustment before the substrate is taken out into the open air subsequent to complete deposition of the metal film, and to replace the internal atmosphere with $N_2$.

Figure 4:
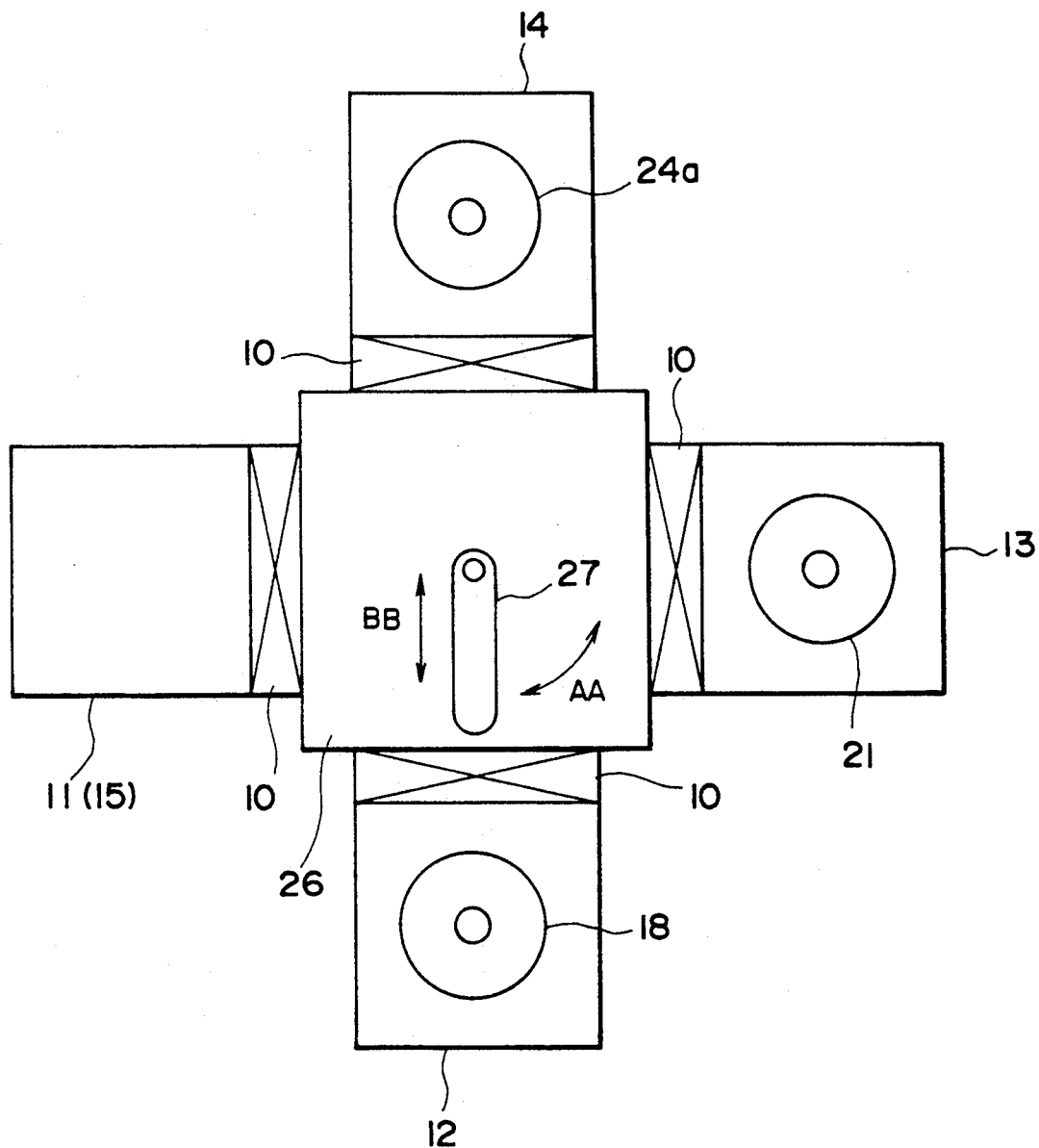

In practice, the metal film continuously forming apparatus thus arranged has such a structure that, as shown in FIG. 4, the load lock chamber 11, the CVD reaction chamber 12, the Rf etching chamber 13, the sputtering chamber 14 and the load lock chamber 15 are interconnected via a transport chamber 26 as a transit chamber. In this structure, the load lock chamber 11 doubles as the load check chamber 15. The transport chamber 26 is provided with an arm (transport means) 27 capable of rotating in directions of AA and expanding/contracting in directions of BB, as shown. By using the arm 27, the substrate can be successively moved, without being exposed to the open air, from the load lock chamber 11, the CVD reaction chamber 12, the Rf etching chamber 13, the sputtering chamber 14 and the load lock chamber 15 in certain order following the steps as indicated by arrows in FIG. 5.

Figure 6:
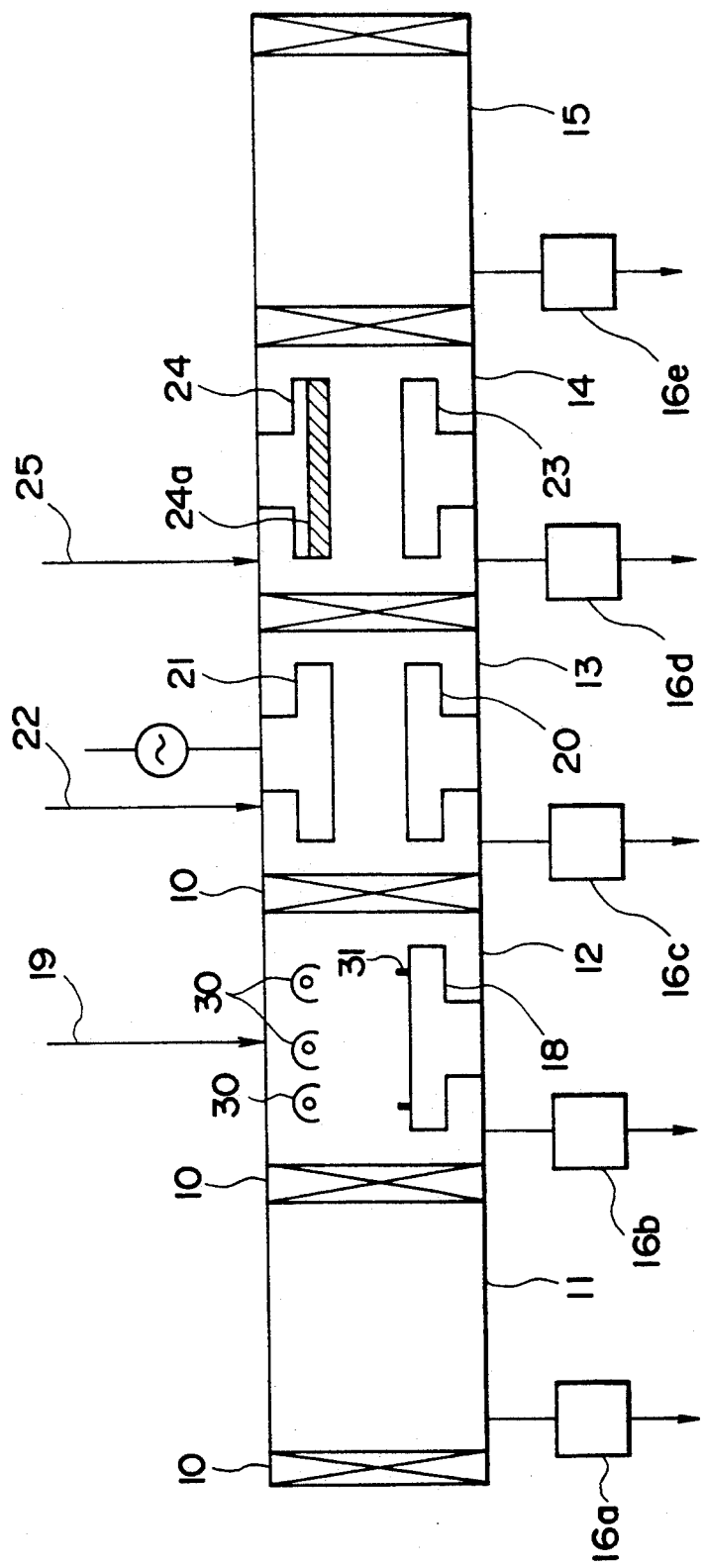
FIGS. 6 to 8 are schematic views showing other examples of the metal film continuously forming apparatus suitable for implementing the present invention.

FIG. 6 shows another structure of the metal film continuously forming apparatus in which the same components as those in FIG. 3 are denoted by the same reference numerals. The apparatus of FIG. 6 is different from the apparatus of FIG. 3 in that halogen lamps 30 are used as the means for heating the substrate surface to carry out direct heating. By adopting such direct heating, the deposition rate can be further improved. Additionally, for effecting the direct heating, a plurality of fingers 31 are disposed on the substrate holder 12 to hold the substrate in a floated condition.

Figure 7:
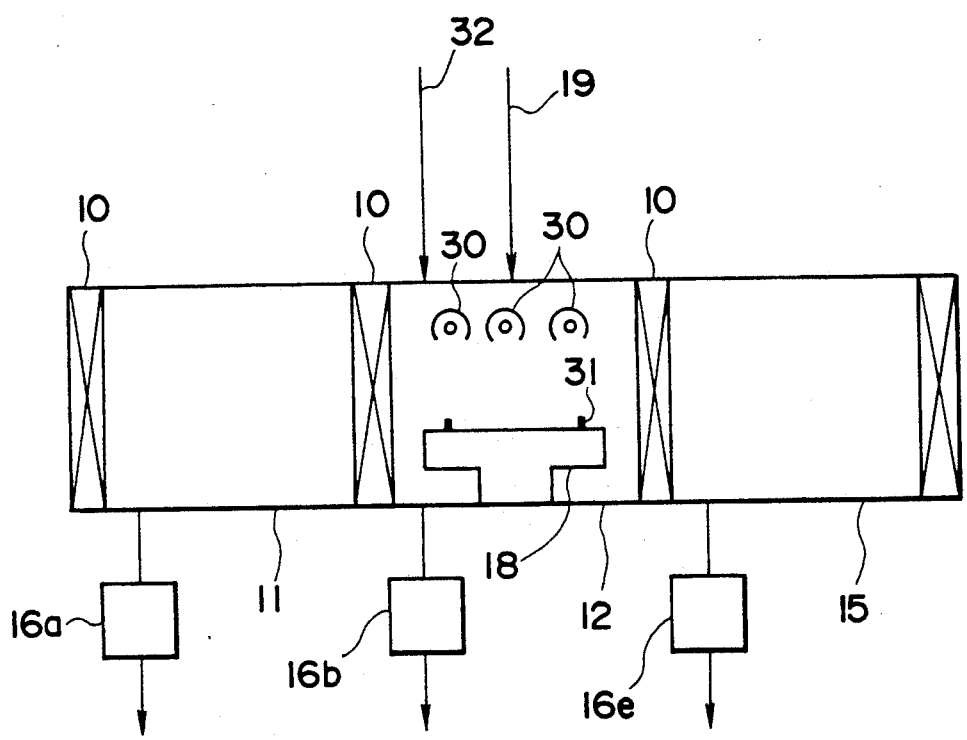

FIG. 7 shows a film forming apparatus for depositing the first metal to form the Al-base film as the electrode and the second metal to form the wiring material consecutively in a single film forming chamber through a vapor phase chemical reaction.

Figure 8:
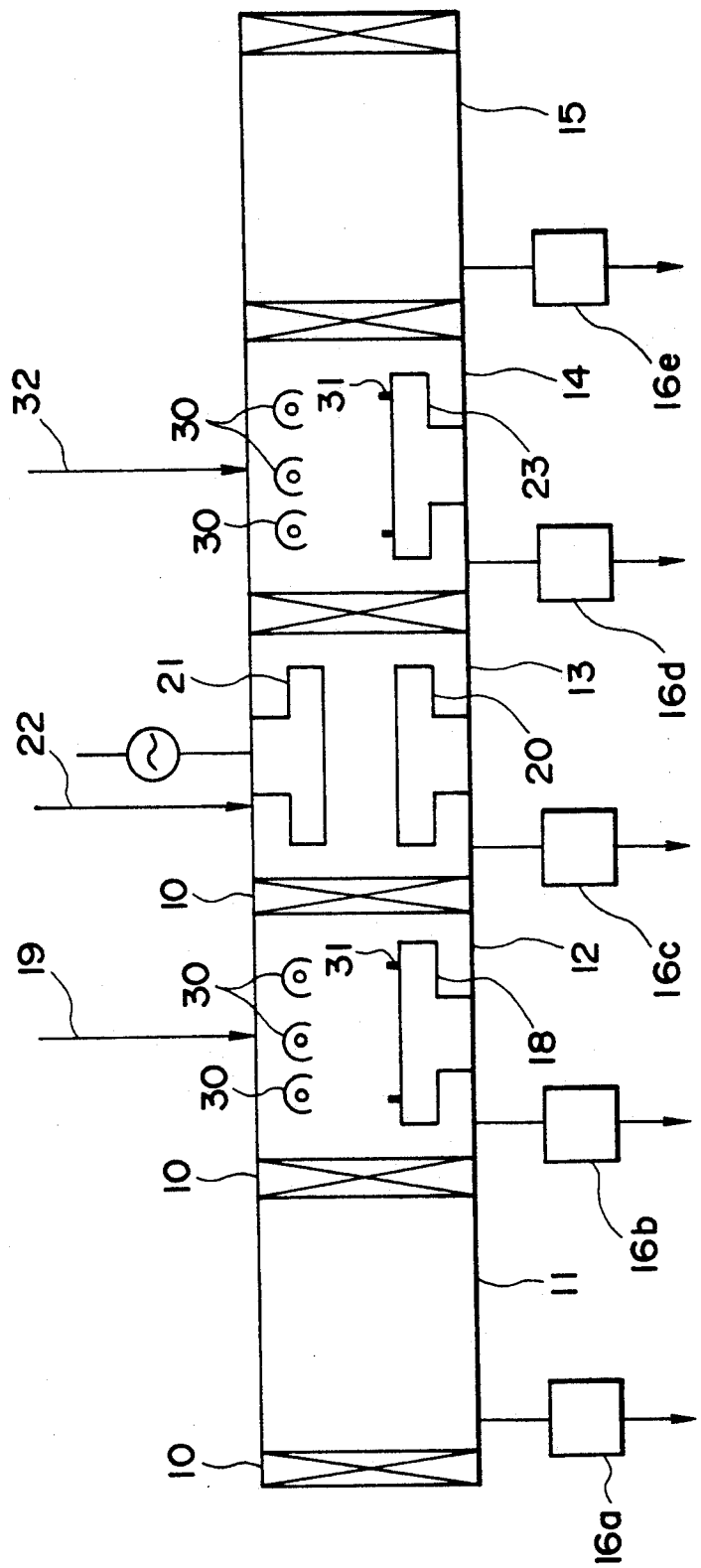

FIG. 8 shows a metal film continuously forming apparatus resulted by modifying the metal film continuously forming apparatus shown in FIG. 3 such that the second film forming chamber is arranged to deposit the second metal through a vapor phase chemical reaction.

The following is Examples (1 to 5) made using the apparatus shown in FIG. 3 (resistance heating) and FIG. 6 (direct heating). Examples 1 to 4 were conducted by the apparatus (FIG. 6) using the more preferable direct heating technique, whereas Example 5 was conducted by the apparatus (FIG. 3) using the resistance heating technique.

Example 6 was conducted using the apparatus shown in FIG. 7 and Example 7 was conducted using the apparatus shown in FIG. 8.

EXAMPLE 1

Figure 9A:
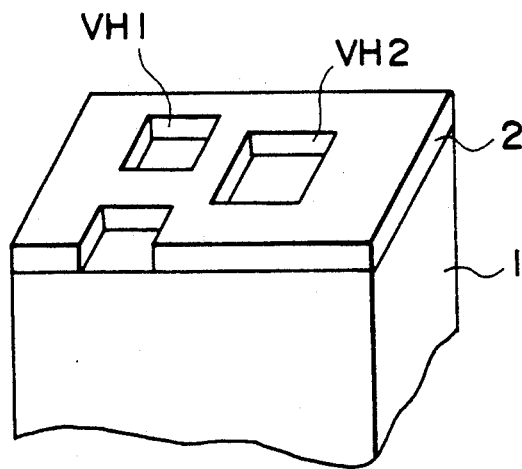
FIGS. 9A to 9C are schematic views of a substrate for explaining a metal film forming method according to the present invention.

First, a substrate was prepared. The substrate is, for example, a sample prepared by forming $SiO_2$ of 8000 Å thick on an N type monocrystalline Si wafer through thermal oxidation. In this sample, square openings (or holes) of various sizes ranging from 0.25 $\mu$m × 0.25 $\mu$m to 100 $\mu$m × 100 $\mu$m are patterned in $SiO_2$ to expose the underlying Si monocrystal. FIG. 9A is a schematic view showing part of the substrate. In the drawing, denoted by 1 is a monocrystalline silicon substrate as a conductive substrate and 2 is a thermally oxidized silicon film as an insulating film (or layer). This substrate will be referred to as a sample 1-1. VH1 and VH2 are openings (i.e., exposed portions) different in size from each other.

An Al film was formed on the substrate 1 as follows.

At first, the substrate 1 was placed in the load lock chamber 11. Hydrogen was introduced to the load lock chamber 11 to build up a hydrogen atmosphere therein, as stated before. Then, the interior of the reaction chamber 12 was evacuated to a vacuum level of about $1 \times 10^{-8}$ Torr using the evacuation system 10.

Note that even if the vacuum level inside the reaction chamber is not as high as $1 \times 10^{-8}$ Torr, the Al film can be formed.

Subsequently, DMAH was supplied to the reaction chamber 12 through a gas line (not shown). $H_2$ was used as carrier gas for the DMAH line.

A second gas line (not shown) was used to supply $H_2$ as reaction gas. While introducing $H_2$ through the second gas line, the opening degree of a slow leak valve (not shown) was adjusted to set a pressure inside the reaction chamber to a predetermined value. A typical pressure under this condition is about 1.5 Torr. DMAH was then introduced to the reaction chamber through the DMAH line. The resulting total pressure was about 1.5 Torr and the partial pressure of DMAH was about $5.0 \times 10^{-3}$ Torr. Afterward, the resistance heater 17 in the substrate holder 18 was energized to directly heat the wafer. In this way, A was deposited.

After the elapse of a predetermined period of deposition time, the supply of DMAH was once suspended. The predetermined period of deposition time in which the A film is deposited in the above step means a period required for the A film thickness on Si (monocrystalline silicon substrate 1) to become equal to a film thickness of $SiO_2$ (thermally oxidized silicon film 2).

Figure 9B:
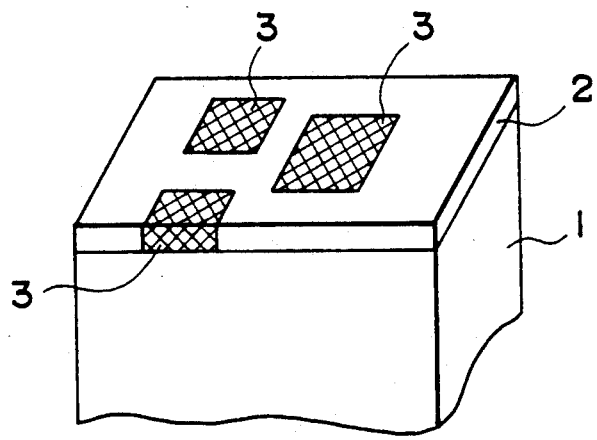

The temperature of the substrate surface at this time was set to 270° C. The foregoing will be referred to as a first deposition step. Through the step explained so far, Al films 3 are selectively deposited in the openings as shown in FIG. 9B.

After completing the above deposition of Al, the CVD reaction chamber 12 was evacuated by the evacuation system 10 to a vacuum level less than $5 \times 10^{-3}$ Torr. At the same time, the Rf etching chamber 13 was evacuated to a vacuum level less than $5 \times 10^{-6}$ Torr. After confirming that both the chambers reached the above desired vacuum levels, the gate valve 10 was opened to move the substrate from the CVD reaction chamber 12 to the Rf etching chamber 13 by using the transport means (arm) 27, followed by closing the gate valve 10.

Upon the substrate being transported to the Rf etching chamber 13, the evacuation system 10 was actuated again to evacuate the Rf etching chamber 13 until reaching a vacuum level less than $10^{-6}$ Torr.

Thereafter, argon was supplied to the Rf etching chamber 13 through the argon supply line 22 for Rf etching to keep an argon atmosphere on the order of $10^{-1}$ to $10^{-3}$ Torr therein. By supplying Rf of 100 W to the Rf etching electrode 21 for 60 seconds, argon was discharged in the Rf etching chamber 13 so that the substrate surface was etched by argon ions to remove the surface layer of the CVD deposited film. The etching depth at this time was about 100 Å in terms of oxide.

Note that although the surface etching of the CVD deposition film was carried out in the Rf etching chamber, the Rf etching may not be performed because the surface layer of the CVD film on the substrate transported through a vacuum contains oxygen, etc. in the atmosphere. In this case, the Rf etching chamber 13 functions as a temperature modifying chamber to carry out a temperature change in a short period of time, when a temperature difference between the CVD reaction chamber 12 and the sputtering chamber 14 is large.

After the completion of the Rf etching in the Rf etching chamber 13, the inflow of argon was stopped and the argon inside the Rf etching chamber 13 was exhausted. Then, the Rf etching chamber 13 was evacuated up to a vacuum level of $5 \times 10^{-6}$ Torr and the sputtering chamber 14 was evacuated to a vacuum level less than $5 \times 10^{-6}$ Torr, followed by opening the gate valve 10. Thereafter, the substrate was moved using the arm 27 from the Rf etching chamber 13 to the sputtering chamber 14, followed by closing the gate valve 10.

Upon the substrate being transported to the sputtering chamber 14, the substrate holder 23 in the chamber 14 was heated to 250° C. in the argon atmosphere at $10^{-1}$ to $10^{-3}$ Torr as with the Rf etching chamber 13.

In this example, argon discharge was carried out with power of DC 7 kW to cut Cu of the target material for depositing Cu on the substrate at a deposition rate of 10000 Å/min. The above step is a non-selective deposition step.

This step will be referred to as a second metal film deposition step.

After depositing a Cu film of 5000 Å on the substrate, the inflow of argon and the application of DC power were both stopped. The load lock chamber 11 (15) was evacuated to a vacuum level less than $5 \times 10^{-3}$ Torr and then the gate valve 10 was opened for moving the substrate. After closing the gate valve 10, $N_2$ gas was introduced to the load lock chamber 11 (15) until reaching the atmospheric pressure, and the substrate was moved outwardly of the apparatus through the gate valve 10.

Film forming conditions of the above second metal film deposition step were as follow. Using Cu as the target, DC power of 5 to 10 kW was applied in the Ar atmosphere at a vacuum level of $10^{-1}$ to $^{-3}$ Torr. The substrate temperature at this time was raised to 200° C. by resistance heating.

Figure 9C:
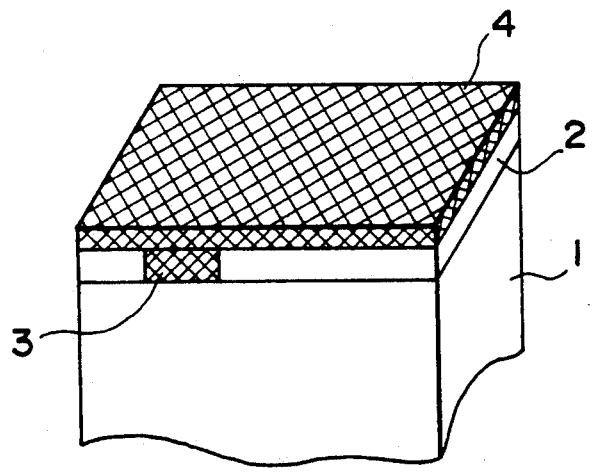

With the above second metal film deposition step, a Cu film 4 was formed on the $SiO_2$ film 2 at the deposition rate of 10,000 Å/min as shown in FIG. 9C. Specific resistance of the Cu film 4 was 1.8 to 2.1 $\mu\Omega$ cm.

Then, again using the substrate prepared in a like manner to the above, an Al film was formed with the first deposition step by setting the surface temperature of the substrate to 280°–480° C. under direct heating. Here, other film forming conditions in the first deposition step and film forming conditions in the second deposition step were all set to the same as those in the above case.

Furthermore, an Al film was formed by setting the surface temperature of the substrate to 200°–260° C. and 490°–550° C. in the first deposition step. The results of all the above cases are listed in Table 1.

TABLE 1

| | Substrate surface temp. (°C.) | | | | | | | | | | | | | |
|---|---|---|---|---|---|---|---|---|---|---|---|---|---|---|
| | 200 | 230 | 250 | 260 | 270 | 280 | 300 | 350 | 400 | 440 | 450 | 460 | 470 | 480 | 490 |
| Deposition rate (Å/min) | 1000~1500 | | | | | 3000~5000 | | | | | | | | | |

TABLE 1-continued

| | \multicolumn{15}{c}{Substrate surface temp. (°C.)} |
| --- | --- | --- | --- | --- | --- | --- | --- | --- | --- | --- | --- | --- | --- | --- | --- |
| | 200 | 230 | 250 | 260 | 270 | 280 | 300 | 350 | 400 | 440 | 450 | 460 | 470 | 480 | 490 |
| Throughput (wafers/h) | | 7~10 | | | | | | | 15~30 | | | | | | |
| Line defects of Si | | not found | | | | | | | | | | | | | |
| Carbon content | | not detected | | | | | | | | | | | | | |
| Resistivity ($\mu\Omega$cm) | 2.7~3.3 | | | | | | | | 2.8~3.4 | | | | | | |
| Reflectance (%) | | 85~95 | | | | | | | 90~95 | | | | ~60 | | |
| Hillock density over 1 $\mu$m (cm$^{-2}$) | 1~10$^2$ | | | | | | | | 0~10 | | | | 10~10$^4$ | | |
| Spike occurrence (%) (breakage probability of 0.15 $\mu$m junction) | 0 | | | | | | | | | | | | 0~30 | | |

As will be apparent from Table 1, Al was selectively deposited in the openings at a deposition rate 3000-5000 Å/min in a range of the substrate surface temperature from 260°-440° C. resulted by direct heating.

Examining characteristics of the Al film inside the openings in the range of the substrate surface temperature from 260°-440° C., carbon was not contained, reflectivity was 2.8-3.4 $\mu\Omega$cm, reflectance was 90-95%, hillock density over 1 $\mu$m was 0-10, and spike occurrence (breakage probability of 0.15 $\mu$m junction) was hardly found. It thus proved that the resulting characteristics were satisfactory.

As a matter of course, satisfactory contact between the Al film and the Cu film formed by sputtering thereon was obtained because of good surface property of the Al film.

On the contrary, in the range of the substrate surface temperature from 200°-250° C., the deposition rate was reduced to 1000-1500 Å/min and the output was also lowered to 7-10 wafers/hour.

When the substrate surface temperature exceeded 440° C., the characteristics of Al film were lowered such that reflectance was less than 60%, hillock density over 1 $\mu$m was 10-10$^4$ cm$^{-2}$, and spike occurrence was 0-33%.

Next, using the above-mentioned steps, an Al film was formed on substrates (samples) constructed as follows.

On monocrystalline silicon as first substrate surface material, an silicon oxide film as second substrate surface was formed by the CVD process and then patterned by a photolithography step to partially expose the monocrystalline silicon surface.

At this time, the thermally oxidized SiO$_2$ film had a thickness of 7000 Å and the exposed portion, i.e., the opening of monocrystalline silicon had size of 2.5 $\mu$m×3 $\mu$m to 10 $\mu$m×10 $\mu$m. A sample 1-2 was thus prepared. (Hereinafter, such a sample will be expressed as "CVD SiO$_2$ (hereinafter abbreviated as SiO$_2$)/monocrystalline silicon.)

A sample 1-3 had an expression of an oxide film doped with boron and formed by CVD at normal pressure (hereinafter abbreviated as BSG)/monocrystalline silicon.

A sample 1-4 had an expression of an oxide film doped with phosphor and formed by CVD at normal pressure (hereinafter abbreviated as PSG)/monocrystalline silicon.

A sample 1-5 had an expression of an oxide film doped with phosphor and boron and formed by CVD at normal pressure (hereinafter abbreviated as BSPG)/monocrystalline silicon.

A sample 1-6 had an expression of a nitride film formed by plasma CVD (hereinafter abbreviated as P-SiN)/monocrystalline silicon.

A sample 1-7 had an expression of a thermally nitrided film (hereinafter abbreviated as T-SiN)/monocrystalline silicon.

A sample 1-8 had an expression of a nitride film formed by DCVD at reduced pressure (hereinafter abbreviated as LP-SiN)/monocrystalline silicon.

A sample 1-9 had an expression of a nitride film formed by an ECR apparatus (hereinafter abbreviated as ECR-SiN)/monocrystalline silicon.

In addition, samples 1-11 to 1-179 were prepared by combinations of first substrate surface materials and second substrate surface materials. The first substrate surface materials used were monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminum silicon copper (Al-Si-Cu), aluminum paradium (Al-Pd), titanium (Ti), molybdenum silicide (Mo-Si), and tantalum silicide (Ta-Si). The second substrate surface materials used were T-SiO$_2$, SiO$_2$, BSF, PSG, BPSG, P-SiN, T-SiN, LP-SiN and ECR-SiN. The satisfactory Al films were formed for all the above samples as well.

EXAMPLE 2

Figure 5:
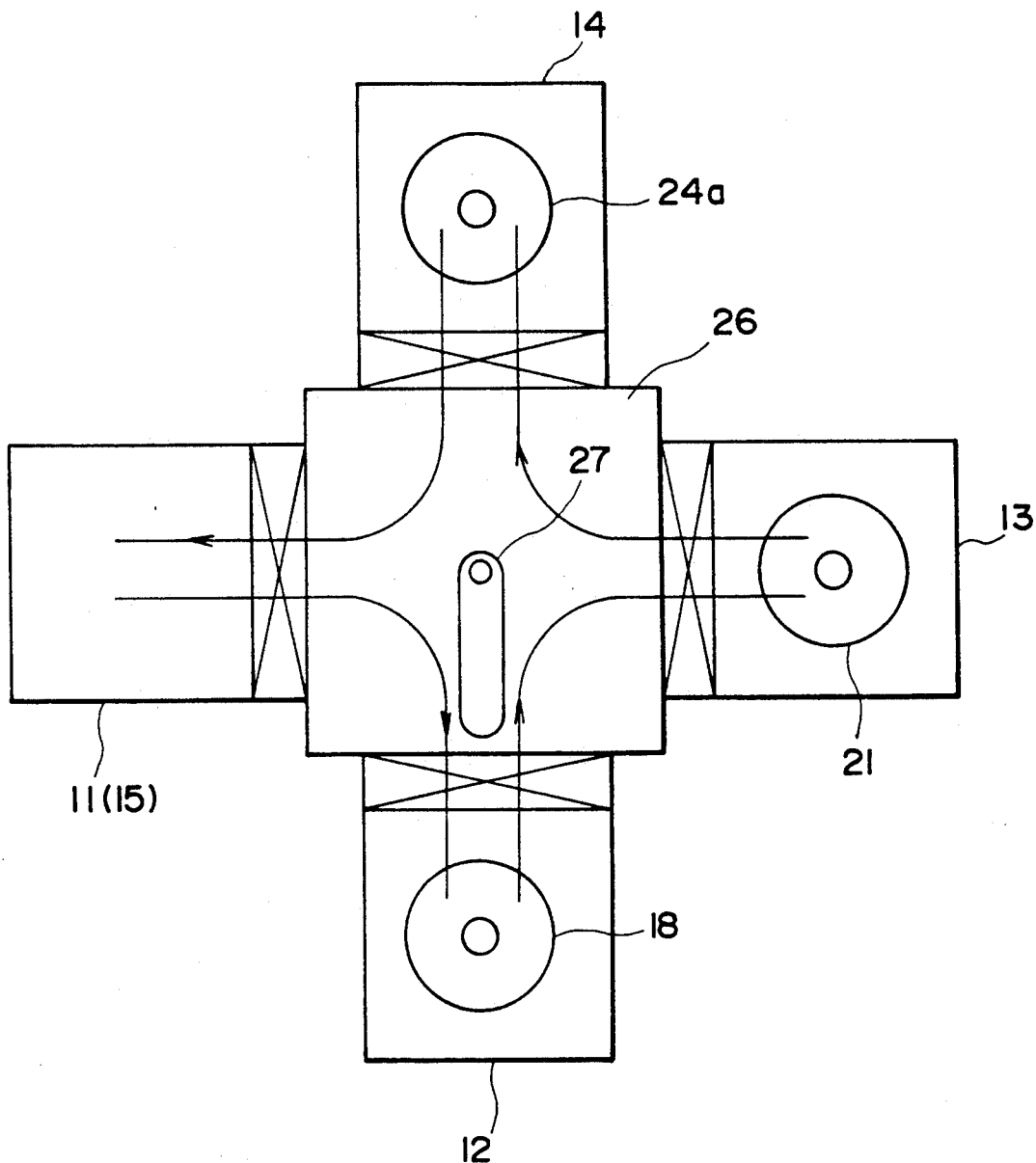

In Example 2 of the present invention, an aluminum (Al) film was formed by employing the apparatus shown in FIG. 5, using DMAH as material gas and hydrogen gas as reaction gas, and directly heating the substrate surface by the halogen lamps 30.

As a substrate, like Example 1, a monocrystalline silicon wafer was prepared by being coated with SiO$_2$ having square openings (or holes) of various sizes ranging from 25 $\mu$m×25 $\mu$m to 100 $\mu$m×100 $\mu$m. This substrate was subjected to, as described later, a first Al film deposition step using the CVD process and a second Ti film deposition step using the sputtering process to form electrodes and a wiring.

Following the same procedures as those in Example 1, DMAH and hydrogen were transported to the CVD reaction chamber 12 to deposit Al.

Conditions of the first Al film deposition step were as follows; total pressure of 1.5 Torr, DMAH partial pressure of 1.5×10$^{-4}$ Torr, and the substrate surface temperature of 270° C.

With the above first Al film deposition step, Al was deposited in the openings of various size at a deposition rate of 3000 to 5000 Å/min with good selectivity. Then, the substrate was transferred to the sputtering chamber 14 where Ti was deposited up to a thickness of 5000 Å all over the surface including SiO2 and Al selectively deposited. The deposition rate at this time was 10,000 Å/min.

Moreover, an Al film was formed in a like manner to the above using, as substrates, the same samples 1-11 to 1-179 as those in Example 1. For any samples, satisfactory Al films were formed through the first and second deposition steps.

While the foregoing experiments were made by setting the substrate surface temperature to 270° C., Al films were further formed while increasing that temperature in steps of 10° C. in a range of 200° C. to 550° C.

Characteristics of the A films produced on the samples with the first Al deposition step were similar to those shown in Table 1.

EXAMPLE 3

In Example 3, after carrying out the same first Al deposition step as that in Example 1, an Au film was formed by sputtering, as the second deposition step, all over the substrate surface. A prepared substrate had the same construction as that (sample 1-1) used in above Example 1.

After selectively depositing Al in openings with the first Al deposition step, the substrate was transferred into the sputtering chamber 14. Film forming conditions in the sputtering process were as follows.

Au was used as the target and DC power of 7 kW was applied in the Ar atmosphere at a vacuum level of $5 \times 10^{-3}$ Torr.

With the second deposition step in this Example, the Au film was deposited at a deposition rate of 10,000 Å/min. The resulting film had resistivity of 2.5–2.9 $\mu\Omega$cm and was highly resistant against migration.

Evaluation results of above Examples 1 to 3 and Prior Art are listed in Table 2 for comparison.

-continued

| partial pressure of $Si_2H_6$ | $4 \times 10^{-6}$ Torr |
|---|---| in an Al deposition step and, thereafter, an Al-Si-Cu film was formed by sputtering as a second deposition step all over the substrate surface. A prepared substrate had the same construction as that (sample 1-1) used in above Example 1.

After selectively depositing Al-Si in openings with such a first Al-Si deposition step, the substrate was transferred into the sputtering chamber 14. Film forming conditions in the sputtering process were as follows; Cu was used as the target and DC power of 7 kW was applied in the Ar atmosphere.

With the second deposition step in this Example, the Cu film was deposited at a deposition rate of 10,000 Å/min. The resulting film had resistivity of 1.8–2.1 $\mu\Omega$cm and was highly resistant against migration as with Example 1.

EXAMPLE 5

Using the metal film continuously forming apparatus shown in FIG. 3, a film was formed on the same substrate under a temperature condition of 200°–650° C. by resistance heating in a like manner to Example 1.

As a result, under a temperature condition of 160°–450° C., there was obtained a good quality film containing no carbon, having small resistivity on the order of 3 $\mu\Omega$cm, and exhibiting high reflectance. In a more preferably range of 260°–440° C., the deposition rate was as high as 100–800 Å and the wiring was prolonged in service life. In a most preferably range of 270°–350° C., the hillock density was extremely low and the occurrence probability of alloy spikes was also low.

Additionally, the Cu wiring formed by the second metal had low specific resistance and was highly resistant against migration as with Example 1.

TABLE 2

| | 1st Metal | 2nd Metal | 2nd Metal forming process | Specific resistance of 2nd metal | Min. wiring width of IC | 0.8 $\mu$m Contact res. | Electro Migration 150° C. $1 \times 10^6$ A/cm² | |
|---|---|---|---|---|---|---|---|---|
| Ex. 1 | Al (CVD) | Cu | sputtering | 1.8~2.1 $\mu\Omega$cm | 0.5 $\mu$m | 32$\Omega$ | MTTF | 3000 H ↑ |
| Ex. 2 | Al (CVD) | Ti | sputtering | 42~43 $\mu\Omega$cm | 0.8 $\mu$m | 32$\Omega$ | | 3000 H ↑ |
| Ex. 3 | Al (CVD) | Au | sputtering | 2.5~2.9 $\mu\Omega$cm | 0.5 $\mu$m | 32$\Omega$ | | 3000 H ↑ |
| Prior Art 1 | Al (CVD) | Al | sputtering | 3.2~3.5 $\mu\Omega$cm | 0.8 $\mu$m | 32$\Omega$ | | 200~300 H |
| Prior Art 2 | Al (sputtering) | Al | sputtering | 3.2~3.5 $\mu\Omega$cm | 0.8 $\mu$m | 75$\Omega$ | | 200~250 H |

EXAMPLE 4

In Example 4, using the apparatus shown in FIG. 6 like Example 1, Al-Si (0.5%) was deposited, as the first metal, by setting;

| total pressure | 1.5 Torr |
|---|---|
| partial pressure of DMAH | $1.5 \times 10^{-4}$ Torr |

EXAMPLE 6

Using the metal film continuously forming apparatus shown in FIG. 7, a first Al deposition step was carried out similarly to Example 1. After evacuating the film forming chamber 12 up to a high vacuum level by the evacuation device 16b, various kinds of material gas were introduced through the second line 32 for introducing CVD gas to deposit second metal films under direct heating by the halogen lamps 30. Deposition conditions are listed in Table 3 below.

TABLE 3

| Condition | Material Gas | Carrier Gas | Reaction Gas | Partial pressure of Material | Film forming temperature | Total pressure |
|---|---|---|---|---|---|---|
| 1 | Cu(C$_5$H$_7$O$_2$)$_2$ | H$_2$ | H$_2$ | 1.5 × 10$^{-4}$ Torr | 320° C. | 1.5 Torr |
| 2 | Cu(C$_{11}$H$_{19}$O$_2$)$_2$ | " | " | " | " | " |
| 3 | Cu(C$_5$HF$_6$O$_2$)$_2$ | " | " | " | " | " |
| 4 | Ti(CH$_3$)$_4$ | " | " | " | 290° C. | " |
| 5 | TiCl$_4$ | " | " | " | 300° C. | " |
| 6 | AuCl$_2$ | " | " | " | 220° C. | " |
| 7 | (C$_4$H$_9$)PAuCl | " | " | " | 270° C. | " |
| 8 | (CH$_3$)AuH$_2$ | " | " | " | 220° C. | " |
| 9 | (CH$_3$)$_2$AuH | " | " | " | 220° C. | " |

Any of electrode and wiring structures comprising the first metal and the second metal, formed by this Example, had superior characteristics suitable for manufacture of ICs, i.e., low specific resistance and high resistance against migration, like Example 1.

EXAMPLE 7

Using the metal film continuously forming apparatus shown in FIG. 8, a first Al deposition step was carried out similarly to Example 1, and the substrate was moved into the second film forming chamber 14 in the apparatus without being exposed to the open air.

Then, as with Example 6, each of Cu, Au and Ti was deposited as a second metal through chemical vapor phase reaction.

The results were as excellent as those obtained in Example 6.

According to the foregoing embodiments, as explained above, since after selectively depositing aluminum on a substrate, a metal film is non-selectively deposited in a continuous processing manner without making a substrate exposed to the open air, thereby, resulting in an advantage that the metal film having superior film characteristics such as step coverage and electro migration can be formed at a high deposition rate.

Other embodiments of the present invention will be described below. In these embodiments, at a connecting portion between conductors connected to semiconductor elements, i.e., electrodes, (opening interiors will be here referred to as electrodes) and wirings interconnecting the electrodes (conductor patterns principally provided on an insulating film and the electrodes will be here referred to as wirings), a relationship of A=B, more preferably A>C, is established where A is a length of one side of the upper surface of each electrode and C is a width of the wiring connected to the electrodes. Specifically, A is selected from a range of 0.5 μm to 1.0 μm and C is selected from a range of 0.4 μm to 1.0 μm so as to meet the above relationship.

Furthermore, a value of C is preferably in a range of 50% to 70%, most preferably in a range of 40% to 60%, of the hole size A.

When A is 1.0 μm, for example, C is in a range of 0.4 μm to 1.0 μm, more preferably in a range of 0.4 μm to 0.8 μm taking alignment accuracy into account, most preferably in a range of 0.5 μm to 0.7 μm taking further step coverage into account.

Figure 10A:
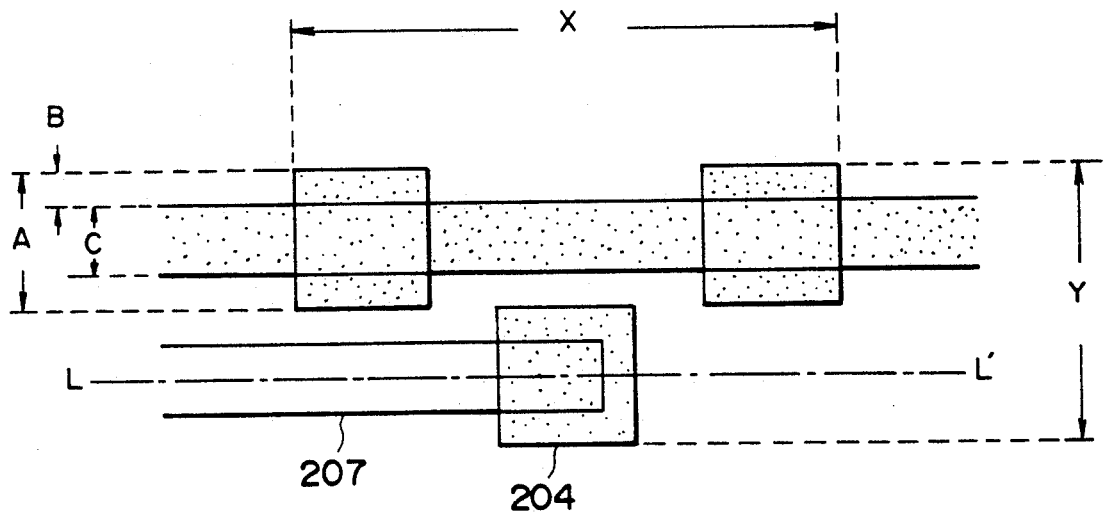
FIGS. 10A and 10B are schematic views for explaining an electrode structure of a semiconductor element according to another embodiment of the present invention.
Figure 10B:
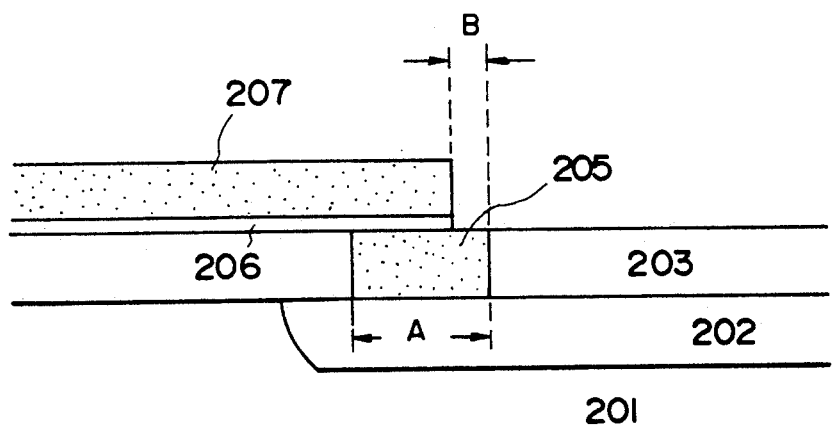

FIGS. 10A and 10B are schematic views for explaining an electrode structure according to one of preferred embodiments of the present invention, in which FIG. 10A corresponds to a plan view and FIG. 10B a sectional view.

In FIGS. 10A and 10B, denoted by 201 is a P- or N-type semiconductor substrate, 202 is a function area (diffusion area of) an impurity) for a source, drain, base, emitter, collector or ohmic contact, 203 is an insulating film formed of a silicon oxide, silicon nitride, organic resin coating or the like, 204 is a contact hole (with size of A×A; A=1.0 μm) as an opening, 205 is an electrode area filled or buried in the contact hole 104, 206 is a barrier metal formed of TiN, W or the like, and 207 is a wiring formed of Al, Cu or the like (wiring width C; C=0.6 μm).

Here, the electrode 205 is rectangular in shape and arranged to be directly connected to the semiconductor area which is provided on a principal plane of the semiconductor substrate. The wiring 207 including 206 is connected to part of the upper surface of each electrode.

This electrode structure is effective to further reduce the element size and improve the performance when applied to source and drain electrodes in the case of an insulating gate type FET, or when applied to base and emitter electrodes in the case of a bipolar transistor.

More specifically, in the case of an FET, since the resistance and capacity of a main electrode are reduced and the distance between the main electrode and a control electrode is made smaller, the resulting structure is suitable for a reduction in the element size and speed-up. In the case of a bipolar transistor, since the base resistance and the base-emitter capacity are reduced, the resulting structure is also suitable for a reduction in the element size and speed-up with a reduced emitter clouding effect.

Further, when connecting one wiring and a second wiring to each other, the electrode structure with high density and high reliability can also be achieved.

Figure 1A:
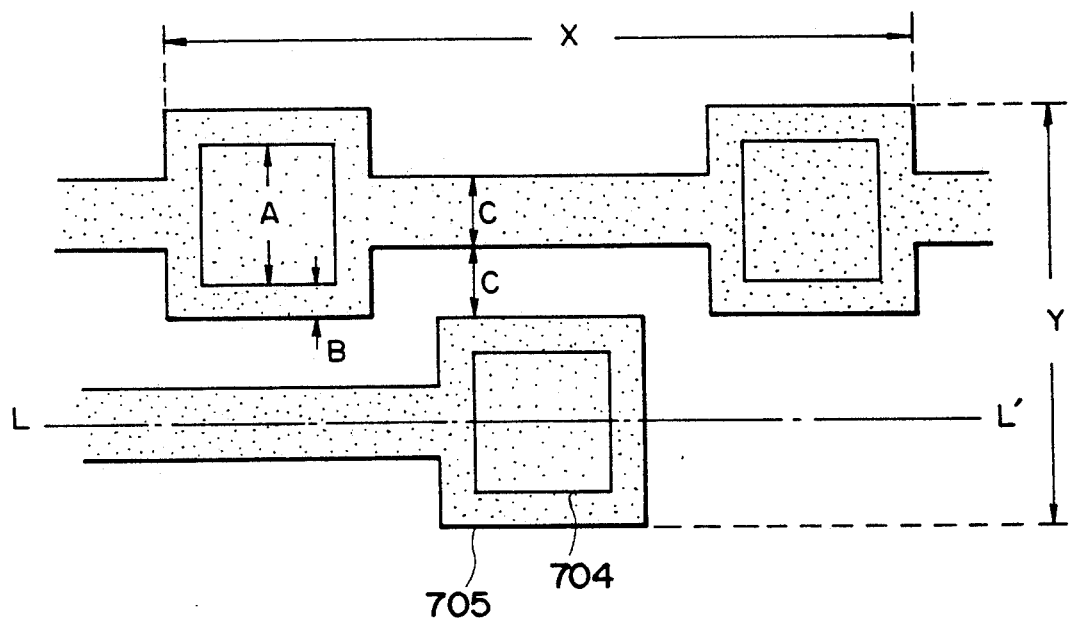
FIGS. 1A and 1B are schematic views for explaining an electrode structure of a semiconductor element.
Figure 1B:
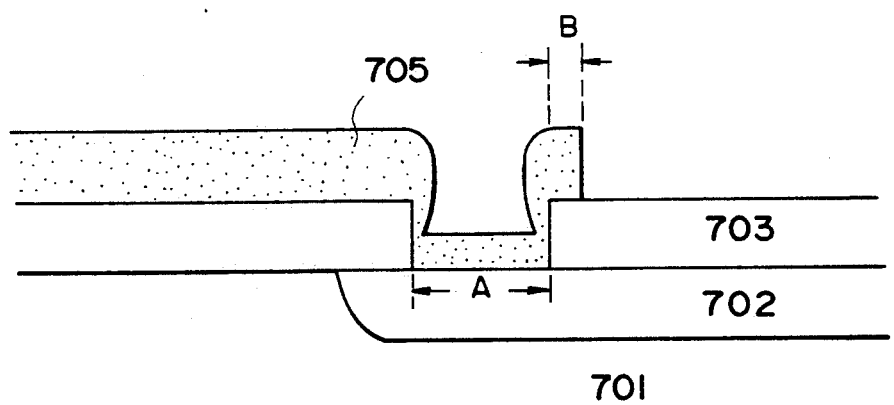

Comparing two dimensions X and Y between the structure of FIGS. 10A and 10B and the structure of FIGS. 1A and 1B, it will be understood that the dimension X is reduced by a length of 6×B and the dimension Y is reduced by a length of 4×B. With this embodiment, it is also possible to remarkably srduce oan overlap margin between the contact hole and the electrode.

FILM FORMING METHOD

The buried electrode according to this embodiment is formed similarly to the embodiments shown in FIGS. 2 to 8.

While Al deposited in the opening bored in the electron donor surface, e.g., the insulating film, to expose the surface of the semiconductor substrate exhibits a monocrystalline structure, the Al-CVD process stated before can also selectively deposit a metal film containing Al as a main ingredient as follows and the resulting film quality shows excellent characteristics.

For example, conductive material such as Al-Si, Al-Ti, Al-Cu, Al-Si-Ti or Al-Si-Cu may be selectively deposited to form the electrode by introducing, in addition to gas of an alkylaluminum hydride and hydrogen, any proper combination of;

gas containing Si atoms such as given by SiH$_4$, Si$_2$H$_6$, Si$_3$H$_8$, Si(CH$_3$)$_4$, SiCl$_4$, SiH$_2$Cl$_2$ and SiHCl$_3$, gas containing Ti atoms such as given by TiCl$_4$, TiBr$_4$ and Ti(CH$_3$)$_4$, and Cu atoms such as given by copper bis-diacetylacetonate Cu(C$_5$H$_7$O$_2$)$_2$, copper bis-dibivaloylmethanite Cu(C$_{11}$H$_{19}$O$_2$)$_2$ and copper bis-hexafluoroacetylacetonate Cu(C$_5$HF$_6$O$_2$)$_2$, for producing an atmosphere of mixture gas to thereby form the electrode.

Further, since the Al-CVD process is a film forming method with superior selectivity and deposits a film having a satisfactory surface property, there can be resulted a metal film which is highly versatile and suitable as wirings of semiconductor devices, by applying a non-selective film forming method as a next deposition step to form a metal film made of Al or containing Al as a main ingredient over the selectively deposited A film, SiO$_2$ as the insulating film and so forth.

Specifically, by way of example, the resulting metal film is given by any proper combination of the selectively deposited Al, Al-Si, Al-Ti, Al-Cu, Al-Si-Ti or Al-Si-Cu and the non-selectively deposited Al, Al-Si, Al-Ti, Al-Cu, Al-Si-Ti or Al-Si-Cu.

The film forming method for the non-selectively deposition includes other CVD process than the above Al-CVD process, the sputtering process, etc. (Film Forming Apparatus)

A film forming apparatus suitable to form the electrode according to the present invention will be next described.

Figure 11:
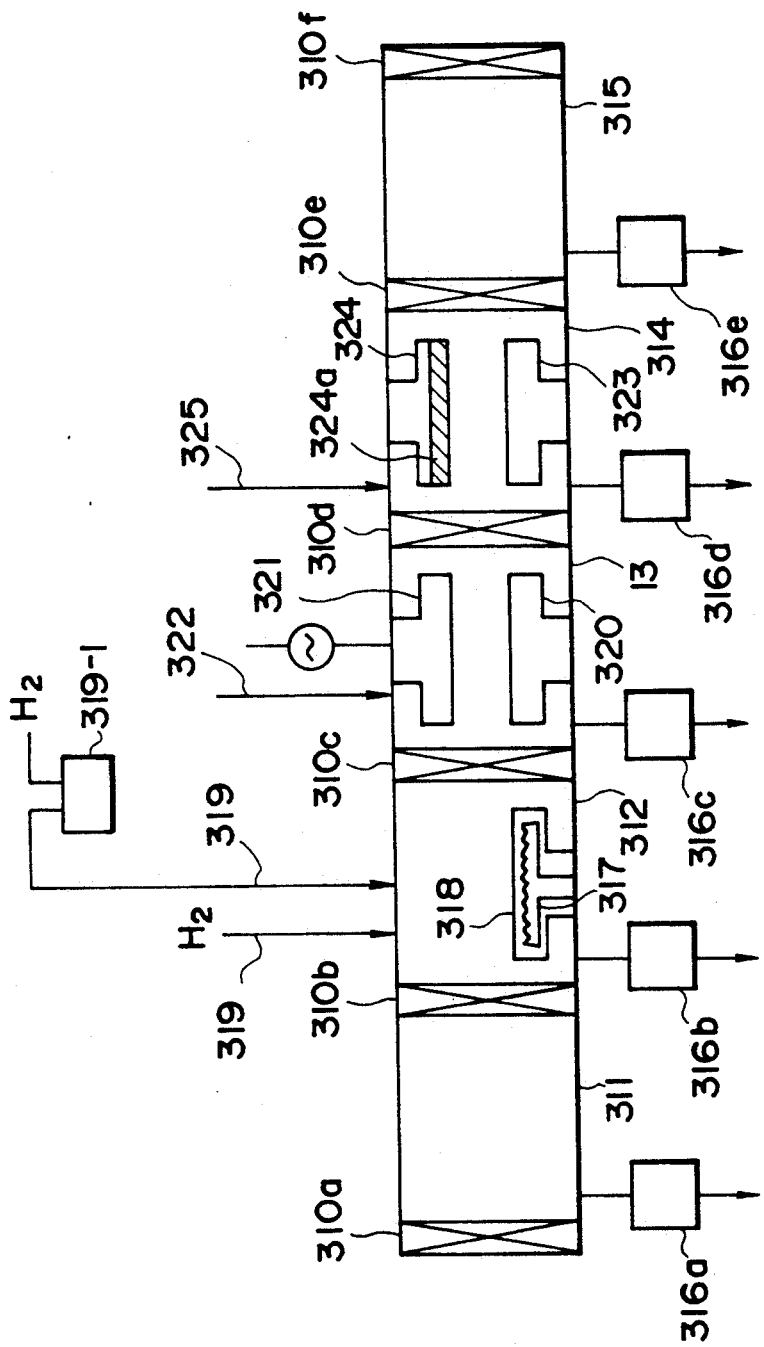
FIGS. 11 and 12 are schematic views for explaining a manufacture apparatus suitable for fabricating a semiconductor device, using the electrode structure of FIG. 10, according to the embodiment of the present invention.
Figure 12:
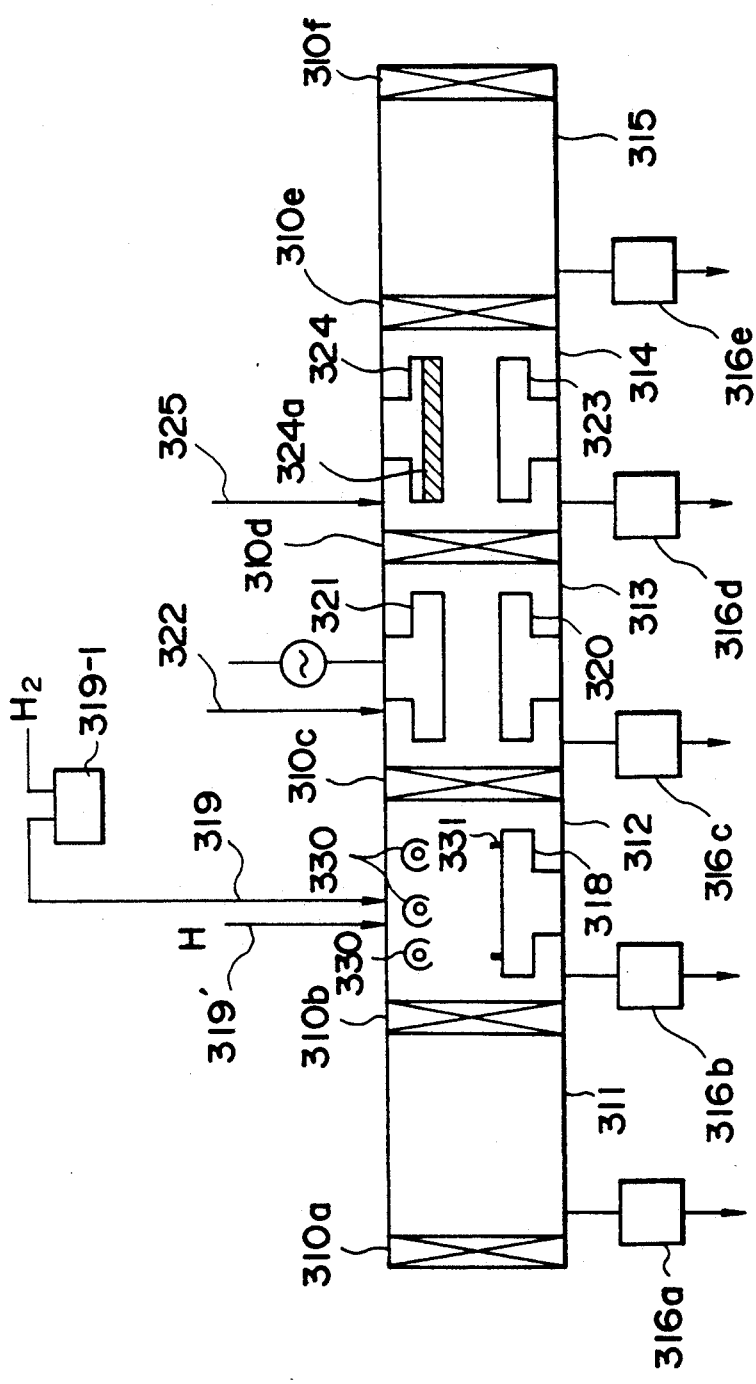

FIGS. 11 and 12 schematically illustrate preferred examples of a metal film continuously forming apparatus for implementing the above-stated film forming method.

One example of the metal film continuously forming apparatus comprises, as shown in FIG. 11, a load lock chamber 311, a CVD reaction chamber 312 as a first film forming chamber, an Rf etching chamber 313, a sputtering chamber 314 as a second film forming chamber, and a load lock chamber 315 which are joined to be communicated with each other successively through gate valves 310a to 310f under a condition cut off from the open air. The interiors of those chambers can be respectively evacuated into a depressurized state by evacuation systems 316a to 316e. The load lock chamber 311 is used to evacuate an atmosphere around the substrate before the deposition process and to replace it with an H$_2$ atmosphere for the purpose of improving a throughput. The next CVD reaction chamber 312 is used to carry out the selective deposition on the substrate by the Al-CVD process, stated before, under normal pressure or reduced pressure. A substrate holder 318 having a resistance heater 317 capable of heating the substrate surface, on which a film is to be formed, to temperatures in a range of at least 200° C.–450° C. is provided inside the chamber 12. Material gas such as an alkylaluminum hydride evaporated by a bubbler 319-1 through bubbling with hydrogen is introduced to the chamber 12 via a CVD gas introduction line 319, and hydrogen gas as reaction gas is also introduced thereto via a gas line 319′. The next Rf etching chamber 313 is used to carry out cleaning (etching) of the substrate surface after the selective deposition under an Ar atmosphere. In the chamber 313, there are provided a substrate holder 320 capable of heating the substrate to temperatures in a range of at least 100° C.–250° C. and an electrode line 321 for Rf etching, with an Ar gas supply line 322 connected to the chamber 313. The next sputtering chamber 314 is used to non-selectively deposit a metal film on the substrate surface by sputtering under the Ar atmosphere. In the chamber 314, there are provided a substrate holder 323 heated to temperatures in a range of at least 200° C.–250° C. and a target electrode 324 to which a sputtering target material 324a is attached, with an Ar gas supply line 325 connected to the chamber 314. The final load lock chamber 315 is used to make an adjustment before the substrate is taken out into the open air subsequent to complete deposition of the metal film, and to replace the internal atmosphere with N$_2$.

FIG. 12 shows another structure of the metal film continuously forming apparatus also suitable for implementing the above-stated film forming method, in which the same components as those in FIG. 11 are denoted by the same reference numerals. The apparatus of FIG. 12 is different from the apparatus of FIG. 11 in that halogen lamps 330 are provided as the means for directly heating the substrate surface. For that purpose, a plurality of fingers 331 are disposed on the substrate holder 312 to hold the substrate in a floated condition.

By directly heating the substrate surface with such a structure, the deposition rate can be further improved as mentioned before.

The buried electrode according to this embodiment is formed in the same manner as that explained in connection with FIGS. 9A and 9B.

EXAMPLE 8

An example 8 is a combined structure of the electrode inside the contact hole, the barrier metal on the electrode, and the primary wiring on the barrier metal, as shown in FIGS. 10A and 10B.

Monocrystalline Al is deposited to form the buried electrode (A=0.8 μm) by using the above-stated selective Al-CVD process and, thereafter, a barrier metal layer of TiN, TiW or the like and an Al layer are non-selectively formed all over the surface by using the sputtering process, etc.

Then, etching is carried out with a pattern given by a wiring mask corresponding to the dimension C=0.6 μm adapted for the present method.

Specifically, only Al is first etched away using gas such as BCl$_3$ in consideration of a selection ratio of resist/Al/TiN. Afterward, only TiN is etched away using gas such as CF$_4$ in consideration of a selection ratio of Al/TiN. As a result, the electrode structure shown in FIG. 10 can be achieved.

EXAMPLE 9

An example 9 is a wiring structure, as shown in FIG. 13, that only the electrode inside the contact hole and the upper surface of the electrode are formed of monocrystalline Al, and the insulating film is coated with polycrystalline Al as a nonmonocrystal.

Figure 13A:
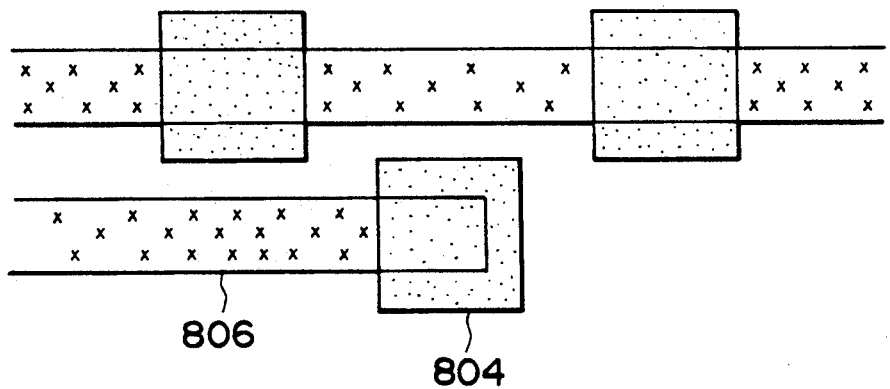
FIGS. 13A, 13B, 14A, 14B, 15A and 15B are schematic views showing other embodiments of the electrode structure of the semiconductor device according to the present invention.
Figure 13B:
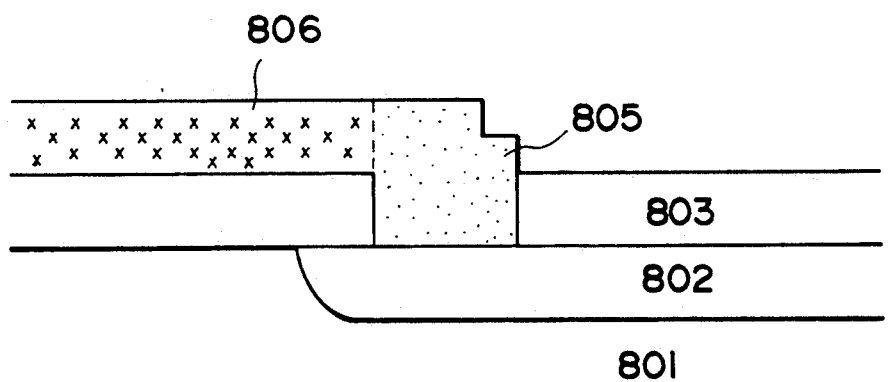

In FIGS. 13A and 13B, denoted by 801 is a semiconductor substrate, 802 is a function area (diffusion area of an impurity), 803 is an insulating film, 804 is a contact hole, 805 is monocrystalline aluminum formed on the semiconductor substrate, and 806 is a wiring formed on the insulating film and made of polycrystalline aluminum.

As with the fourth embodiment, the buried electrode (A=0.8 μm) is formed by using the selective Al-CVD process and, thereafter, Al is deposited to form the wiring by using the non-selective CVD process. Then, etching is carried out with a pattern given by a wiring mask (corresponding to the dimension C=0.7 μm) adapted for the present method. The etching is performed using chlorine-base gas in consideration of a selection ratio of polycrystalline Al/monocrystalline Al. As a result, the electrode structure shown in FIG. 13 can be achieved satisfactorily.

EXAMPLE 10

Figure 14A:
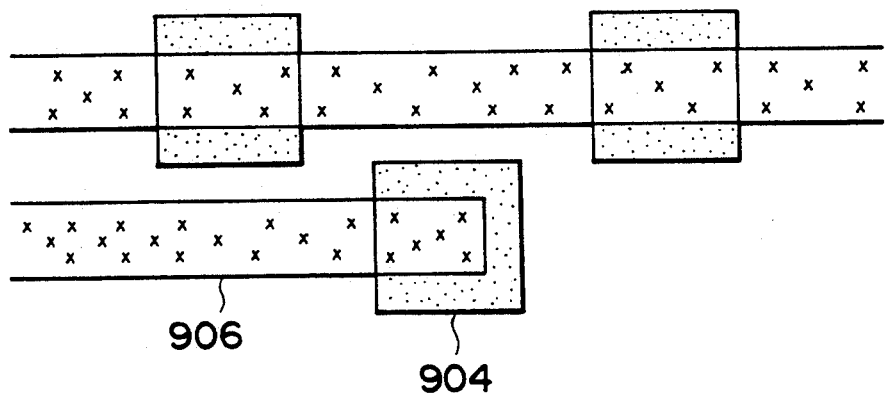
Figure 14B:
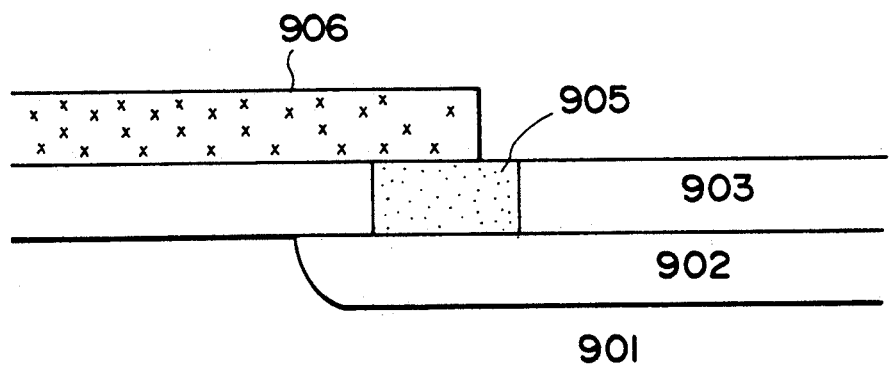

An example 10 is a wiring structure that material of the electrode inside the contact hole and material coated on both the electrode and the insulating film are different from each other, as shown in FIGS. 14A and 14B.

In FIGS. 14A and 14B, denoted by 901 is a semiconductor substrate, 902 is a function area (diffusion area of an impurity), 903 is an insulating film, 904 is a contact hole, 905 is an electrode buried in the contact hole, and 906 is a wiring formed of material different from the electrode material.

As with the fourth embodiment, the buried electrode (A=0.8 μm) made of monocrystalline Al is formed by using the selective Al-CVD process. Thereafter, W or the like as the wiring material is formed by the sputtering process. Then, etching is carried out with a pattern given by a wiring mask adapted for the present method. The etching is performed using $CF_4$-base gas in consideration of a selection ratio of Al/W. As a result, the electrode structure (C=0.5 μm) shown in FIG. 14 can be achieved.

EXAMPLE 11

Figure 15A:
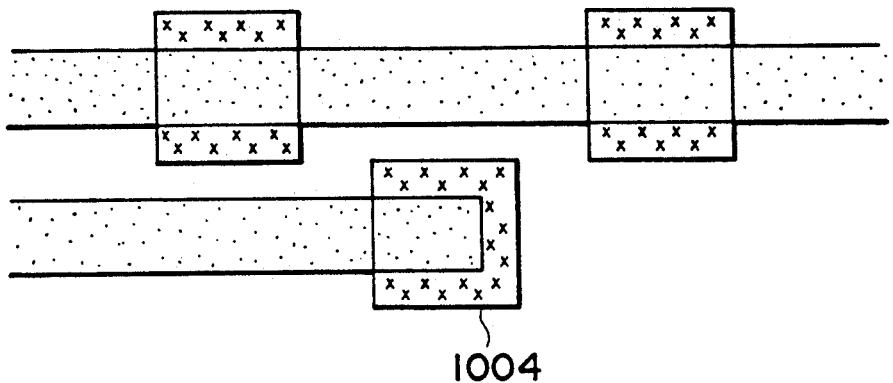
Figure 15B:
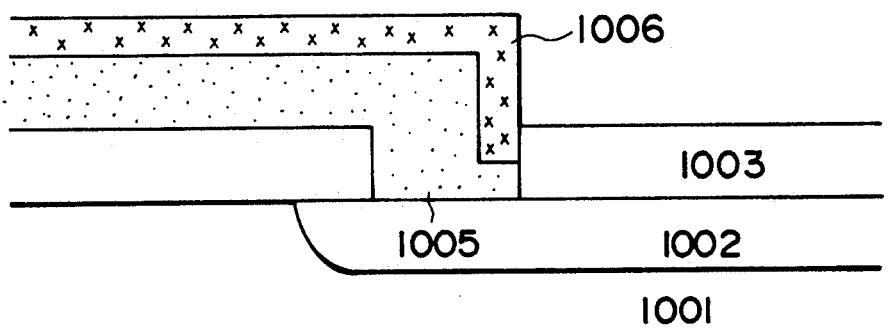

An example 11 is an electrode structure that a wiring thickness is increased as shown in FIGS. 15A and 15B.

In FIGS. 15A and 15B, denoted by 1001 is a semiconductor substrate, 1002 is a function area (diffusion area of an impurity), 1003 is an insulating film, 1004 is a contact hole, 1005 is an electrode and a wiring, and 1006 is the electrode and the wiring of which thickness is increased by the selective CVD process after patterning.

In the electrode structure of the seventh embodiment, when the buried electrode and the wiring are formed of the same material such as Al regardless of the crystal structure, e.g., polycrystal or monocrystal, there is a fear of lowering reliability due to overetching if the etching is carried out by the use of a wiring mask adapted to obtain the wiring according to this aspect of the present invention. In the seventh embodiment, therefore, the selective CVD process is carried out once again after the etching, for increasing a wiring thickness to remarkably improve the reliability. Such a method is especially effective to achieve a wiring which is superior in flatness, has low resistance and is highly resistant against migration, by adopting the Al-CVD process stated above.

APPLICATION TO SEMICONDUCTOR DEVICE

Taking a bipolar transistor as an example, a semiconductor device having the electrode structure of the present invention will be described below in detail in comparison with the prior art.

Figure 16A:
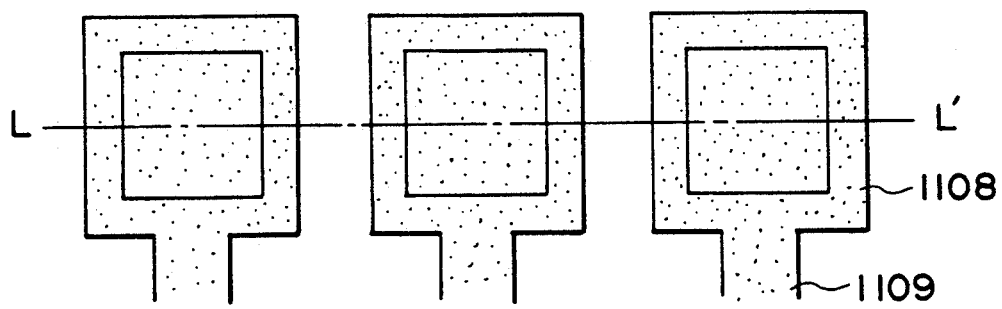
FIGS. 16A and 16B are schematic views for explaining a conventional bipolar transistor.
Figure 16B:
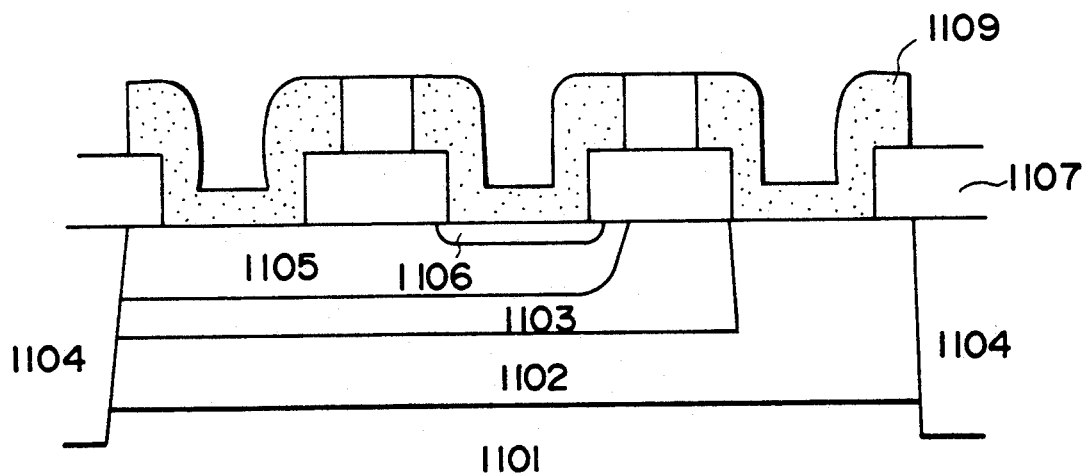
Figure 17A:
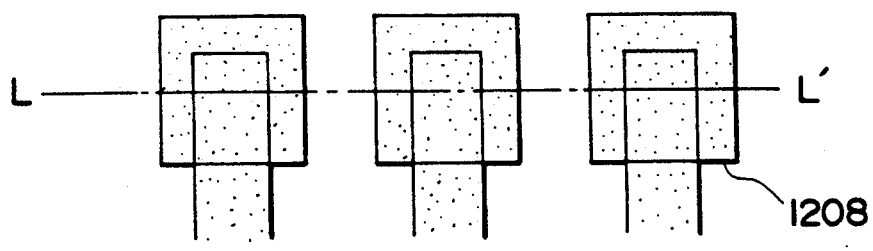
FIGS. 17A and 17B are schematic views for explaining a bipolar transistor according to the present invention.
Figure 17B:
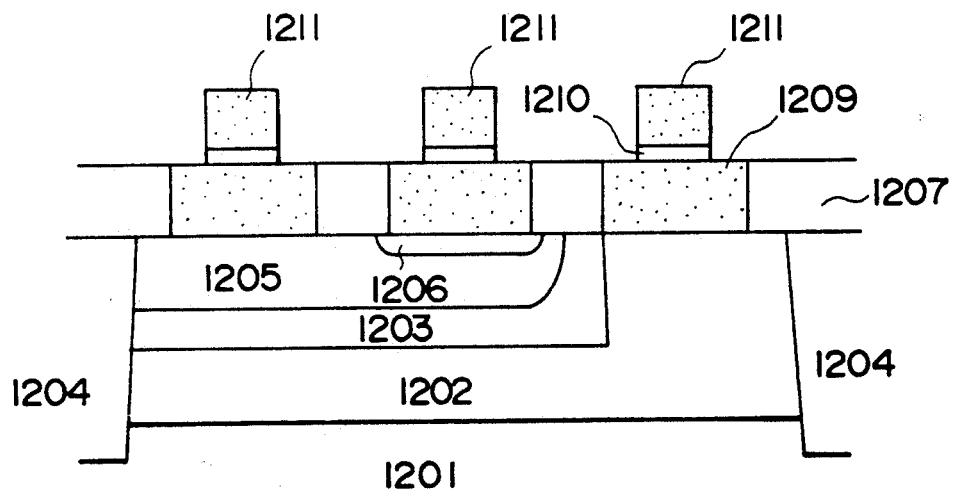

FIGS. 16A and 16B are respectively a plan and sectional view for explaining a conventional bipolar transistor, whereas FIGS. 17A and 17B are respectively a plan and sectional view for explaining a bipolar transistor of the present invention. As will be seen from these drawings, adoption of the present electrode structure in the bipolar transistor enables to reduce the electrode-to-electrode distance and the wiring-to-wiring distance, which in turn enables a reduction in size of the diffusion area. Accordingly, the capacity and the resistance value can be lowered to provide a bipolar transistor capable of operating at a high speed.

In each of FIGS. 16A to 17B, a collector area 1102; 1202 and a low impurity concentration area 1103; 1203 are provided on the principal plane side of a semiconductor substrate 1101; 1201. A base area 1105; 1205 and then N+ type emitter area 1106; 1206 are formed thereon. On the principal surface of the semiconductor substrate incorporating the bipolar transistor thus formed, there are further formed electrodes 1108; 1209 and wirings 1109; 1210, 1211. Denoted by 1107; 1207 is an insulating film between layers, and 1104; 1204 is a trench separation area. Although an insulating film necessary for the wiring is not shown here, it will be apparently understood from configurations of the underlying electrodes and wirings that the present structure can provide more excellent step coverage than the prior art in formation of the insulating film.

EXPLANATION OF MANUFACTURE METHOD

A method of manufacturing the present bipolar transistor stated above will be explained below.

First, As is implanted into a silicon substrate 1201 of monocrystalline P type to form a buried area 1202 for reducing collector resistance. Subsequently, an N⁻ type collector area 1203 is formed through epitaxial growth. Then, the portion in which an element separation area 1204 is to be formed is etched away. An oxide film or polycrystalline silicon is deposited to fill the trench bored by the etching, for thereby forming the element separation area 1204. After that, B is doped at a desired position through ion injection to form a P-type base area 1205. Further, P is diffused into the base area 1205 to form an N+ type emitter area 1206.

On the principal plane of the semiconductor substrate having respective semiconductor areas thus formed, a silicon oxide film 1207 is formed as an insulating film by the CVD process. A contact hole 1208 with square size of 0.8×0.8 μm is then defined by reactive ion etching. Here, the insulating film may be a multi-layered insulating film such as given by a combination of $SiO_2$ produced by the thermal oxidation process and a silicon oxide film including boron and phosphor (i.e., BPSG).

Next, by using the above-stated Al-CVD process, particularly the thermal CVD process in which DMAH is used as material gas, hydrogen is used as reaction gas, and the substrate surface is kept at a temperature about 270° C., Al is selectively deposited in the contact hole to form an electrode 1209 made of monocrystalline Al.

Further, a TiN film 1210 is deposited in a thickness of about 1000 Å by the sputtering process and, subsequently, a non-selective Al film 1211 is deposited in thickness of about 500–10,000 Å by the sputtering process. Afterward, by using a wring mask adapted for the present method, Al is first etched with chlorine-base gas. TiN is then etched with $CF_4$-base gas by using the patterned Al as a mask. In this way, the bipolar transistor having the structure shown in FIG. 12 and a wiring width of 0.5 μm can be obtained.

A ring oscillator which employs several hundreds of transistors produced by the foregoing manufacture method was fabricated and subjected to a characteristic test and an endurance test.

As a result, characteristics such as signal delay and failure due to long-run operation were improved as compared with the prior art, and a degree of integration can also be improved without reducing yield in production.

According to this aspect of the present invention, there can be provided a semiconductor device which is reduced in element size and has high reliability. Also, since margins are selected appropriately, the degree of freedom in design is increased so that a semiconductor device suitable for driving at a high speed and a large current can be provided at the reduced cost.

In order to obtain a good yeilding ratio, it is most desirable to use the metal film forming processes according to the examples 1-7 in the examples 8-11 as shown in FIGS. 10A, 10B, 13A, 13B, 14A, 14B, 15A, 15B, 16A, 16B, 17A and 17B.

What is claimed is:

1. A semiconductor device comprising:
   a semiconductor element provided on a surface of a semiconductor substrate;
   an insulating layer provided on said surface, with an opening provided therein;
   a metal electrode filling within said opening;
   a metal wiring pattern provided on said insulating layer, wherein said semiconductor element and said metal wiring pattern are interconnected through said metal electrode; and
   an upper surface of said metal electrode at a connecting portion between said metal electrode and said metal wiring pattern is substantially flat, and is substantially aligned with an upper surface of said insulating layer; and
   a relationship of $A > C$ is established where A is a length of one side of the upper surface of said electrode and C is a width of said wiring in said connecting portion therebetween.

2. A semiconductor device according to claim 1, wherein a barrier metal is disposed between said electrode and said wiring.

3. A semiconductor device according to claim 1, wherein said electrode is formed of monocrystalline aluminum and said wiring is formed of polycrystalline aluminum.

4. A semiconductor device according to claim 1, wherein said electrode and said wiring are formed of different materials from each other.

5. A semiconductor device according to claim 1, wherein said electrode and said wiring are formed of the same material.

* * * * *

UNITED STATES PATENT AND TRADEMARK OFFICE
CERTIFICATE OF CORRECTION

PATENT NO. : 5,302,855
DATED : April 12, 1994
INVENTOR(S) : SHIGEYUKI MATSUMOTO, ET AL.

It is certified that error appears in the above-identified patent and that said Letters Patent is hereby corrected as shown below:

ON TITLE PAGE

In [57] ABSTRACT:
   Line 1, "manufacture" should read --manufacturing--.
   Line 8, "electrodes in each" should read
        --electrodes in each of--.

COLUMN 1

Line 56, "0.5 Torr," should read --0.5 Torr.--.
Line 68, "removed away." should read --removed.--.

COLUMN 2

Line 32, "so" should be deleted.

COLUMN 4

Line 54, "manufacture" should read --manufacturing--.
Line 58, "manufacture" should read --manufacturing--.

COLUMN 5

Line 24, "curred" should read --curring--.
Line 49, "wherein;" should read --wherein,--.

COLUMN 6

Line 20, "invention," should read --invention.--.

COLUMN 10

Line 42, "follow." should read --follows.--.

UNITED STATES PATENT AND TRADEMARK OFFICE
CERTIFICATE OF CORRECTION

PATENT NO. : 5,302,855
DATED : April 12, 1994
INVENTOR(S) : SHIGEYUKI MATSUMOTO, ET AL.

It is certified that error appears in the above-identified patent and that said Letters Patent is hereby corrected as shown below:

COLUMN 11

Line 46, "an" should read --a--.

COLUMN 12

Line 63, "follows;" should read --follows:--.
Line 67, "size" should read --sizes--.

COLUMN 13

Line 65, "setting;" should read --setting:--.

COLUMN 14

Line 33, "preferably" should read --preferable--.

COLUMN 16

Line 55, "srduce oan" should read --reduce an--.

COLUMN 17

Line 3, close up right margin.
Line 4, close up left margin.
Line 5, "of;" should read --of:--.
Line 31, "etc. (Film" should read --etc. FILM FORMING APPARATUS--.
Line 32 should be deleted.

UNITED STATES PATENT AND TRADEMARK OFFICE
CERTIFICATE OF CORRECTION

PATENT NO. : 5,302,855
DATED : April 12, 1994
INVENTOR(S) : SHIGEYUKI MATSUMOTO, ET AL.

It is certified that error appears in the above-identified patent and that said Letters Patent is hereby corrected as shown below:

COLUMN 21

Line 2, "manufacture" should read --manufacturing--.

Signed and Sealed this

Sixth Day of December, 1994

Attest:

BRUCE LEHMAN

Attesting Officer — Commissioner of Patents and Trademarks